United States Patent
Baik et al.

(10) Patent No.: US 11,862,743 B2
(45) Date of Patent: Jan. 2, 2024

(54) OPTO-ELECTRONIC DEVICE AND IMAGE SENSOR INCLUDING THE SAME

(71) Applicant: SAMSUNG ELECTRONICS CO., LTD., Suwon-si (KR)

(72) Inventors: Chanwook Baik, Yongin-si (KR); Kyungsang Cho, Gwacheon-si (KR); Hojung Kim, Suwon-si (KR); Yooseong Yang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/459,686

(22) Filed: Aug. 27, 2021

(65) Prior Publication Data

US 2022/0262968 A1    Aug. 18, 2022

(30) Foreign Application Priority Data

Feb. 17, 2021    (KR) .................. 10-2021-0021450

(51) Int. Cl.
*H01L 31/0384*    (2006.01)
*H01L 31/112*    (2006.01)
(Continued)

(52) U.S. Cl.
CPC .. *H01L 31/03845* (2013.01); *H01L 27/14643* (2013.01); *H01L 27/14679* (2013.01);
(Continued)

(58) Field of Classification Search
CPC ......... H01L 31/03845; H01L 31/02161; H01L 31/1126; H01L 31/1136; H01L 31/0336; H01L 31/035218; H01L 31/1129; H01L 27/1461; H01L 27/1462; H01L 27/14643; H01L 27/14679
See application file for complete search history.

(56) References Cited

U.S. PATENT DOCUMENTS 7,927,900 B2    4/2011    Ko et al.
9,478,592 B2    10/2016    Park et al.
(Continued)

FOREIGN PATENT DOCUMENTS

KR    10-1348025 B1    1/2014
KR    10-2016-0065380 A    6/2016

OTHER PUBLICATIONS

Cho et al., "Color-selective photodetection from intermediate colloidal quantum dots buried in amorphous-oxide semiconductors," Nature Communications, vol. 8, No. 840, DOI: 10.1038/s41467-017-00893-x, 2017, Total 9 pages.
(Continued)

*Primary Examiner* — Sitaramarao S Yechuri
(74) *Attorney, Agent, or Firm* — Sughrue Mion, PLLC

(57) ABSTRACT

An opto-electronic device includes a base portion, a first electrode and a second electrode formed on an upper surface of the base portion apart from each other, a quantum dot layer, and a bank structure. The quantum dot layer is between the first electrode and the second electrode on the base portion and includes a plurality of quantum dots. The bank structure covers at least partial regions of the first electrode and the second electrode, defines a region where the quantum dot layer is formed, and is formed of an inorganic material.

20 Claims, 23 Drawing Sheets

(51) Int. Cl.
  *H01L 31/113*   (2006.01)
  *H01L 31/0216*  (2014.01)
  *H01L 27/146*   (2006.01)
  *H01L 31/0336*  (2006.01)

(52) U.S. Cl.
  CPC .... *H01L 31/02161* (2013.01); *H01L 31/1126* (2013.01); *H01L 31/1136* (2013.01); *H01L 31/0336* (2013.01)

(56) References Cited

U.S. PATENT DOCUMENTS

| | | |
|---|---|---|
| 2004/0201048 A1 | 10/2004 | Seki et al. |
| 2005/0170076 A1 | 8/2005 | Seki et al. |
| 2005/0170550 A1 | 8/2005 | Seki et al. |
| 2007/0194297 A1* | 8/2007 | McCarthy .............. B82Y 30/00 257/14 |
| 2009/0020751 A1 | 1/2009 | Seki et al. |
| 2014/0103193 A1* | 4/2014 | Lee .................. H01L 27/14679 257/21 |
| 2015/0357480 A1 | 12/2015 | Yu et al. |
| 2019/0189815 A1* | 6/2019 | Cho ................ H01L 31/022408 |
| 2019/0363215 A1* | 11/2019 | Adinolfi ............ H01L 31/02019 |

OTHER PUBLICATIONS

Adinolfi et al., "Photovoltage field-effect transistors," Nature, Letter, doi:10.1038/nature21050, 2017, Total 5 pages.

Lee et al., "Enhanced photocurrent of Ge-doped InGaO thin film transistors with quantum dots," Applied Physics Letters, vol. 106, No. 031112, 2015, Total 6 pages.

Liu et al., "Photo-modulated thin film transistor based on dynamic charge transfer within quantum-dots-InGaZnO interface," Applied Physics Letters, vol. 104, No. 113501, Mar. 17, 2014, Total 6 pages.

* cited by examiner

10x50 µm

5x25 µm

10x10 μm

5x5 μm

OPTO-ELECTRONIC DEVICE AND IMAGE SENSOR INCLUDING THE SAME

CROSS-REFERENCE TO RELATED APPLICATION

This application claims priority to Korean Patent Application No. 10-2021-0021450, filed on Feb. 17, 2021, in the Korean Intellectual Property Office, the disclosure of which is incorporated by reference herein in its entirety.

BACKGROUND

1. Field

Example embodiments of the present disclosure relate to opto-electronic devices and image sensors including the opto-electronic devices, and more particularly, to opto-electronic devices including a plurality of quantum dots and image sensors including the opto-electronic devices.

2. Description of Related Art

As a resolution of an image sensor increases, a size of a pixel in the image sensor is gradually reduced. For example, in recent years, a size of a pixel in a high-resolution image sensor used in a mobile device such as a smartphone has been reduced to 1 μm or less. When the size of pixel is reduced in this way, a light-receiving region of a light-receiving element for sensing light is reduced, and the number of photons incident on a pixel per unit time is reduced. Accordingly, a fraction of dark noise of a signal output from the light-receiving element of the pixel relatively increases and a signal-to-noise ratio thereof is reduced, and thus, it is difficult to obtain a clear image. Research on a light-receiving element that may reduce dark noise and increase light-receiving efficiency by improving the technical limitation has been conducted.

SUMMARY

Provided are opto-electronic devices capable of achieving low dark noise and a high signal-to-noise ratio by using quantum dots as a light-absorbing material, and image sensors including the opto-electronic devices.

Additional aspects will be set forth in part in the description which follows and, in part, will be apparent from the description, or may be learned by practice of the presented embodiments of the disclosure.

In accordance with an aspect of an example embodiment, an opto-electronic device includes a base portion; a first electrode provided on an upper surface of the base portion; a second electrode provided on the upper surface of the base portion and spaced apart from the first electrode; a quantum dot layer provided between the first electrode and the second electrode on the base portion, the quantum dot layer including a plurality of quantum dots; and a bank structure covering at least a first partial region of the first electrode and at least a second partial region of the second electrode, the bank structure defining a region where the quantum dot layer is formed and comprising an inorganic material.

A light-receiving region of the opto-electronic device may include the quantum dot layer, and an uppermost surface of the bank structure may be higher than an upper surface of the light-receiving region.

A first stripe of the bank structure may be provided on a first side of the quantum dot layer and a second stripe of the bank structure may be provided on a second side of the quantum dot layer opposite to the first side, or the bank structure may surround the quantum dot layer.

The bank structure may have a rectangular ring structure.

The bank structure may include an inorganic oxide.

The bank structure may comprise any one of $SiO_2$, $Si_3N_4$, $Al_2O_3$, and $HfO_2$.

The opto-electronic device may further include an oxide layer formed on at least one side of the quantum dot layer, wherein the plurality of quantum dots are in contact with the upper surface of the base portion and the oxide layer covers the plurality of quantum dots, or wherein the plurality of quantum dots are in contact with an upper surface of the oxide layer, or wherein the plurality of quantum dots are surrounded by the oxide layer.

The oxide layer may include a transparent oxide semiconductor material.

The transparent oxide semiconductor material may include at least one selected from among silicon indium zinc oxide (SIZO), silicon zinc tin oxide (SZTO), indium gallium zinc oxide (IGZO), indium zinc oxide (IZO), zinc tin oxide (ZTO), and indium tin oxide (ITO).

The base portion may include a first semiconductor layer doped with a first conductivity; and a second semiconductor layer provided on an upper surface of the first semiconductor layer, the second semiconductor layer being doped with a second conductivity different from the first conductivity, wherein the upper surface of the base portion includes an upper surface of the second semiconductor layer, wherein the first electrode and the second electrode are electrically connected to the second semiconductor layer, and wherein the quantum dot layer is formed between the first electrode and the second electrode on the second semiconductor layer.

The base portion may further include a first doped region and a second doped region spaced apart from the first doped region, the first doped region and the second doped region may be doped with different concentrations from a concentration of the second semiconductor layer, the first electrode and the second electrode may be electrically connected respectively to the first doped region and the second doped region, and the bank structure may be in contact with the upper surface of the second semiconductor layer in a region of the second semiconductor layer between the first doped region and the second doped region to block electrical connection between the quantum dot layer and the first and second doped regions.

The second semiconductor layer may be formed by doping a partial region of the base portion with the second conductivity, or the second semiconductor layer may be formed on the first semiconductor layer to have a step difference from the first semiconductor layer.

The base portion may include a substrate; a gate provided on the substrate; and an insulating layer provided on the substrate, wherein the first electrode and the second electrode are spaced apart from each other on the insulating layer, wherein the first electrode extends on a first side of the gate and the second electrode extends on a second side of the gate opposite to the first side, wherein the gate is positioned below and between the first electrode and the second electrode, and wherein the bank structure is formed to define the region of the quantum dot layer on the first electrode and the second electrode.

The substrate may include a glass substrate or a semiconductor substrate.

An image sensor may include an array of a plurality of opto-electronic devices; and a drive circuit configured to output signals respectively received from the plurality of opto-electronic devices, wherein each of the plurality of opto-electronic devices comprises an opto-electronic device according to an above-noted aspect of the disclosure.

The base portion of each of the plurality of opto-electronic devices may include a first semiconductor layer doped with a first conductivity; and a second semiconductor layer provided on an upper surface of the first semiconductor layer, the second semiconductor layer being doped with a second conductivity different from the first conductivity, wherein the upper surface of the base portion includes an upper surface of the second semiconductor layer, wherein the first electrode and the second electrode are electrically connected to the second semiconductor layer, and wherein the quantum dot layer is formed between the first electrode and the second electrode on the second semiconductor layer.

The base portion may further include a first doped region and a second doped region spaced apart from the first doped region, the first doped region and the second doped region may be doped with different concentrations from a concentration of the second semiconductor layer, the first electrode and the second electrode may be electrically connected respectively to the first doped region and the second doped region, and the bank structure may be in contact with the upper surface of the second semiconductor layer in a region of the second semiconductor layer between the first doped region and the second doped region to block electrical connection between the quantum dot layer and the first and second doped regions.

The second semiconductor layer may be formed by doping a partial region of the base portion with the second conductivity, or the second semiconductor layer may be formed on the first semiconductor layer to have a step difference from the first semiconductor layer.

The base portion may include a substrate; a gate formed on the substrate; and an insulating layer formed on the substrate, wherein the first electrode and the second electrode are formed apart from each other on the insulating layer, wherein the first electrode extends on a first side of the gate and the second electrode extends on a second side of the gate opposite to the first side, and wherein the bank structure is formed to define the region of the quantum dot layer on the first electrode and the second electrode.

The substrate may include a glass substrate or a semiconductor substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
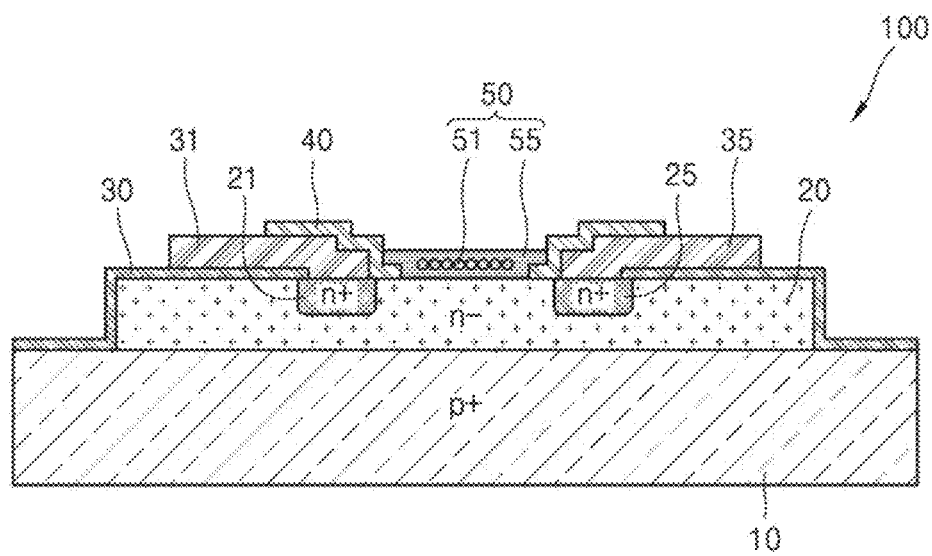
FIG. 1 is a cross-sectional view schematically showing a structure of an opto-electronic device according to an example embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described in detail with reference to the accompanying drawings. In the following drawings, the same reference numerals refer to the same components, and sizes of respective components in the drawings may be exaggerated for the sake of clear and convenient description. The embodiments described below are merely examples, and various modifications may be made from the embodiments.

Hereinafter, terms "upper portion" or "on" may include not only members that are directly above in contact therewith, but also members that are above not in contact therewith. Terms such as first and second may be used to describe various elements but are used only for the purpose of distinguishing one element from another element. The terms are not intended to limit differences in materials or structures of components. A singular expression includes plural expressions unless the context clearly indicates otherwise. In addition, when a portion "includes" a certain component, this means that other components may be further included rather than excluding other components unless specifically stated to the contrary. The use of a term "above-described" and instruction terms similar thereto may correspond to both the singular and the plural.

Unless explicitly stated or contradicted to the order of steps constituting the method, the steps may be performed in an appropriate order and are not limited to the described order.

In addition, terms such as " . . . portion" and "module" mean units that process at least one function or operation, which may be implemented as hardware or software, or a combination of hardware and software.

Connections or connecting members of lines between components shown in the drawings are illustrative representations of functional connections and/or physical or circuit connections and may be represented as alternative or additional various functional connections, physical connections, or circuit connections, in an actual device.

All examples or example terms are used to merely describe the technical idea in detail and the scope is not limited by the examples or example terms unless limited by the claims.

Most image sensors have a structure of an array of photodiodes using a silicon process. However, other materials have to be used in the near infrared (about 750 nm to about 2,500 nm) due to the of light absorption limitation due to a band gap energy of silicon. A quantum dot is a semiconductor material and changes in light-absorption wavelength depending on sizes, and for example, an InAs quantum dot absorbs light more easily than silicon at a wavelength of 1,100 nm or more and is expected to be used without environmental issues in the near infrared band. When quantum dots are placed on an image sensor or an optical sensor to form a device, the degree of light absorption may be changed into a voltage or a current by using characteristics of a diode or a transistor of a silicon substrate. In addition, when a 3T or 4T (here, T represents a transistor) circuit is formed on a silicon substrate, a drive circuit suitable for an image sensor may be provided.

Figure 2:
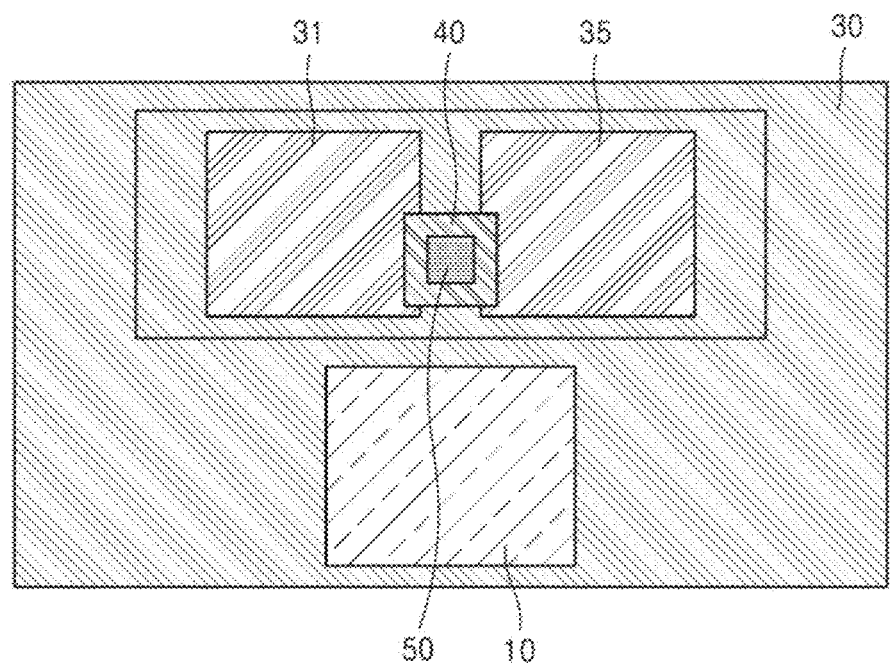
FIG. 2 shows an example of a plan view of FIG. 1.

FIG. 1 is a cross-sectional view schematically showing a structure of an opto-electronic device 100 according to an example embodiment. FIG. 2 shows an example of a plan view of FIG. 1.

Referring to FIGS. 1 and 2, the opto-electronic device 100 according to the embodiment includes a base portion, first and second electrodes 31 and 35 formed to be apart from each other on an upper surface of the base portion, a quantum dot layer 50 between the first electrode 31 and the second electrode 35 on the base portion, and a bank structure 40 formed to cover at least a partial region of the first and second electrodes 31 and 35 limiting (e.g., defining) a region where the quantum dot layer 50 is formed and formed of an inorganic material. In other words, the bank structure 40 may cover a first partial region of the first electrode 31 and a second partial region of the second electrode 35.

In the opto-electronic device 100 according to the example embodiment, the base portion includes a first semiconductor layer 10 doped with a first conductivity type (e.g., a first conductivity), and a second semiconductor layer 20 that is arranged on an upper surface of the first semiconductor layer 10 and doped with a second conductivity type (e.g., a second conductivity) different from the first conductivity type. In this case, an upper surface of the base portion may correspond to an upper surface of the second semiconductor layer 20, and the first and second electrodes 31 and 35 may be electrically connected to the second semiconductor layer 20. In addition, the quantum dot layer 50 may be formed on the second semiconductor layer 20 to be positioned between the first electrode 31 and the second electrode 35. In addition, the base portion may further include first and second doped regions 21 and 25 that are apart from each other on the second semiconductor layer 20 and doped with a concentration different from that of the second semiconductor layer 20, and the first and second electrodes 31 and 35 may be electrically connected to the first and second doped regions 21 and 25 as shown in FIG. 1. One of the first and second doped regions 21 and 25 may be a source region and the other may be a drain region, and among the first and second electrodes 31 and 35, an electrode electrically connected to the source region may be a source electrode, and an electrode electrically connected to the drain region may be a drain electrode.

The first semiconductor layer 10 may be formed of, for example, a semiconductor material doped with a $p^+$-type of a high concentration. For example, the first semiconductor layer 10 may be formed of silicon (Si), germanium (Ge), or a compound semiconductor material, and may be doped with the $p^+$-type.

The second semiconductor layer 20 may be formed of, for example, a semiconductor material doped with an $n^-$-type. For example, the second semiconductor layer 20 may be formed of a semiconductor material and may be doped with the $n^-$-type opposite to the first semiconductor layer 10 at a lower concentration than that of the first semiconductor layer 10. The second semiconductor layer 20 may be formed of the same type of semiconductor material as that of the first semiconductor layer 10 and may be doped with a conductive type that is electrically opposite to that of the first semiconductor layer 10. Accordingly, the first semiconductor layer 10 and the second semiconductor layer 20 may form a pn junction.

In an example embodiment, the second semiconductor layer 20 may be formed on the first semiconductor layer 10 to have a step difference from the first semiconductor layer 10. For example, the second semiconductor layer 20 may be formed only on a partial region of the first semiconductor layer 10, thereby having a step difference from the first semiconductor layer 10. For example, the first semiconductor layer 10 and the second semiconductor layer 20 may be formed on a substrate such as a semiconductor substrate through a doping process or a deposition process, and in this case, a region corresponding to the second semiconductor layer 20 may be patterned such that the second semiconductor layer 20 is positioned only on a partial region of the first semiconductor layer 10, and thus, the second semiconductor layer 20 may have a step difference from the first semiconductor layer 10. As another example, the first semiconductor layer 10 may be formed by doping a region of a semiconductor substrate corresponding to the first semiconductor layer 10, and the second semiconductor layer 20 may be formed by being deposited on a partial region of the first semiconductor layer 10.

The first and second doped regions 21 and 25 may be formed to be apart from each other in the second semiconductor layer 20 by doping with a different concentration from the second semiconductor layer 20. For example, the first and second doped regions 21 and 25 may be formed by doping partial regions of the second semiconductor layer 20 with an $n^+$-type.

The first and second electrodes 31 and 35 may be formed to be electrically connected to the first and second doped regions 21 and 25, respectively. The first and second electrodes 31 and 35 may be formed of a metal material such as Al, AlN, Ti, TiN, Mo, Pt, Au, Cr, Ni, or Cu. The first and second electrodes 31 and 35 may include various metallic materials used as electrode materials.

The bank structure 40 may be formed to cover at least partial regions of the first and second electrodes 31 and 35 so that a region where the quantum dot layer 50 is formed is limited. In addition, the bank structure 40 may be formed to have an uppermost surface higher than an upper surface of a light-receiving region including the quantum dot layer 50 to limit the region where the quantum dot layer 50 is formed.

By applying the bank structure 40 in which the uppermost surface thereof is higher than the upper surface of the light-receiving region including the quantum dot layer 50, when a plurality of quantum dots 51 of the quantum dot layer 50, for example, colloidal quantum dots (CQDs) mixed with an organic material such as a solvent are spin-coated or ink-jet-sprayed, a layer in which the plurality of quantum dots 51 are evenly arranged may be obtained, and thus, a more uniform quantum dot layer 50 may be formed.

The bank structure 40 may be formed in a split type so that stripes are positioned on both sides of the quantum dot layer 50 or may be formed in a ring structure surrounding the quantum dot layer 50. In the split type of the bank structure 40, a first stripe of the bank structure 40 may be formed on a first side of the quantum dot layer 50 and a second stripe of the bank structure 40 may be formed on a second side of the quantum dot layer 50 opposite to the first side. For example, the bank structure 40 may be formed in a rectangular ring structure. FIG. 2 shows an example of the bank structure 40 formed in a rectangular ring structure.

In addition, in an example embodiment, the bank structure 40 may be formed to be in contact with an upper surface of the second semiconductor layer 20 in a region between the first and second doped regions 21 and 25 to block an electrical connection between the quantum dot layer 50 and the first and second doped regions 21 and 25. For example, the bank structure 40 may be formed over partial regions of upper surfaces of the first and second electrodes 31 and 35, side surfaces of the first and second electrodes 31 and 35 that are close to the quantum dot layer 50, and an upper surface of the second semiconductor layer 20 between the first and second doped regions 21 and 25, and thus, the bank structure 40 may have a stair structure.

To block the electrical connection, the bank structure 40 may be formed of an insulator, for example, of inorganic oxide. The bank structure 40 may be formed of, for example, any one of $SiO_2$, $Si_3N_4$, $Al_2O_3$, and $HfO_2$.

As such, when the bank structure 40 is formed to block the electrical connection between the quantum dot layer 50 and the first and second doped regions 21 and 25, photo carriers generated by light absorption in the quantum dot layer 50 are not directly transferred to the first and second doped regions 21 and 25 and may be transferred thereto through the second semiconductor layer 20 forming a channel.

In addition, an insulating layer 30 may be further formed over the first semiconductor layer 10 and the second semiconductor layer 20. The insulating layer 30 may be formed on the stepped portion of the first semiconductor layer 10 and the second semiconductor layer 20 and up to a portion of the second semiconductor layer 20 reaching the first and second doped regions 21 and 25 on the second semiconductor layer 20, and the first and second electrodes 31 and 35 may be formed to be positioned on the insulating layer 30 and on the first and second doped regions 21 and 25, respectively, to be electrically connected to the first and second doped regions 21 and 25. The insulating layer 30 may be formed of, for example, any one of $SiO_2$, $Si_3N_4$, $Al_2O_3$, and $HfO_2$.

As such, when the insulating layer 30 is further provided over the first semiconductor layer 10 and the second semiconductor layer 20, due to the presence of the insulating layer 30, the first electrode 31 and the second electrode 35 may form a stepped structure, and the bank structure 40 may be formed to cover stepped portions of the first and second electrodes 31 and 35.

As such, the first and second electrodes 31 and 35 may be apart from each other and formed in the stepped structure so as to be electrically connected to the first and second doped regions 21 and 25, respectively, on an upper surface of the base portion, and the bank structure 40 may be formed to be in contact with an upper surface of the second semiconductor layer 20 and cover the stepped portions of the first and second electrodes 31 and 35, thereby blocking an electrical connection between the quantum dot layer 50 and the first and second doped regions 21 and 25 in the upper surface of the base portion.

Figure 3:
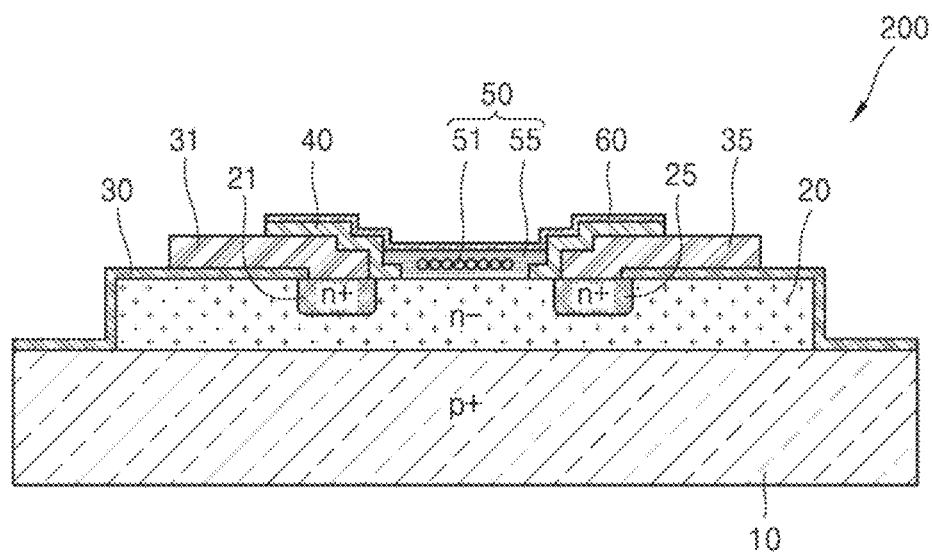
FIG. 3 is a schematic cross-sectional view of a structure of an opto-electronic device according to an example embodiment.
Figure 4:
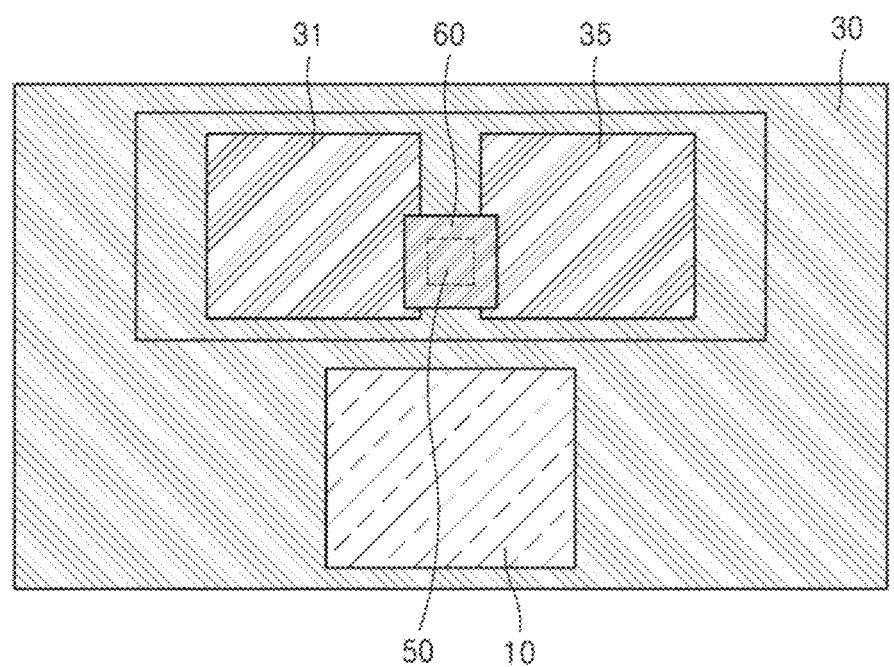
FIG. 4 shows an example of a plan view of FIG. 3.

FIG. 3 is a schematic cross-sectional view of a structure of an opto-electronic device 200 according to an example embodiment. FIG. 4 shows an example of a plan view of FIG. 3. The example embodiments of FIGS. 3 and 4 differ from the example embodiments of FIGS. 1 and 2 in that a protective layer 60 is further provided on an uppermost portion of a light-receiving region. The protective layer 60 may be formed over the quantum dot layer 50 and the bank structure 40. The protective layer 60 may stably protect the quantum dot layer 50 by preventing penetration of oxygen ($O_2$), moisture ($H_2O$), foreign materials, and so on. For example, the protective layer 60 may be formed of any one of insulating materials such as $Al_2O_3$, $HfO_2$, and $ZrO_2$. The protective layer 60 may be formed by, for example, an atomic layer deposition (ALD) method. The protective layer 60 may also be formed of a material such as $SiO_2$.

The opto-electronic devices 100 and 200 according to the example embodiments shown in FIGS. 1 to 4 may be formed, for example, by applying an n-channel epi-wafer on a p+ substrate.

Figure 5:
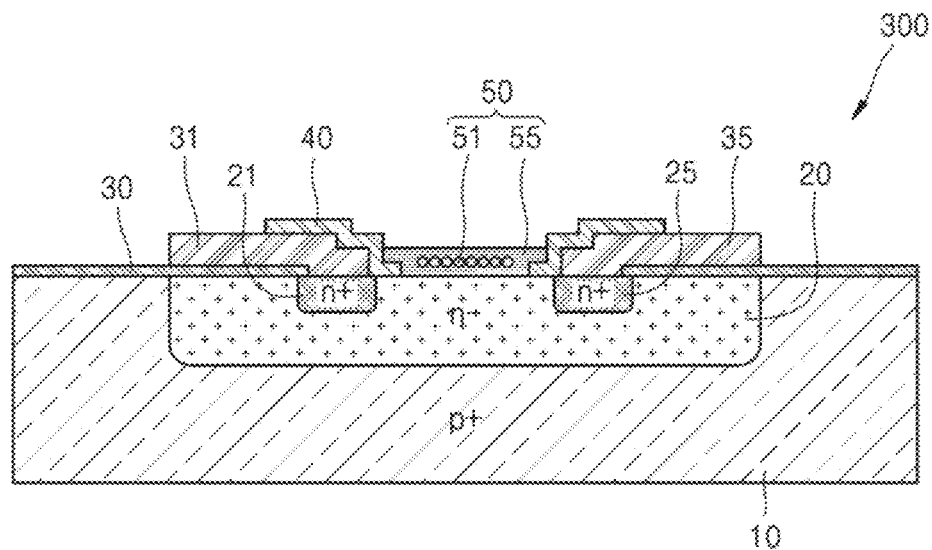
FIG. 5 is a schematic cross-sectional view of a structure of an opto-electronic device according to an example embodiment.

FIG. 5 is a schematic cross-sectional view of a structure of an opto-electronic device 300 according to an example embodiment. The example embodiment of FIG. 5 differs from the example embodiment of FIG. 1 in which the second semiconductor layer 20 is formed by doping a partial region of the semiconductor substrate in which the first semiconductor layer 10 is formed with a second conductivity type, instead of forming the second semiconductor layer 20 to be stepped from the first semiconductor layer 10.

Figure 6:
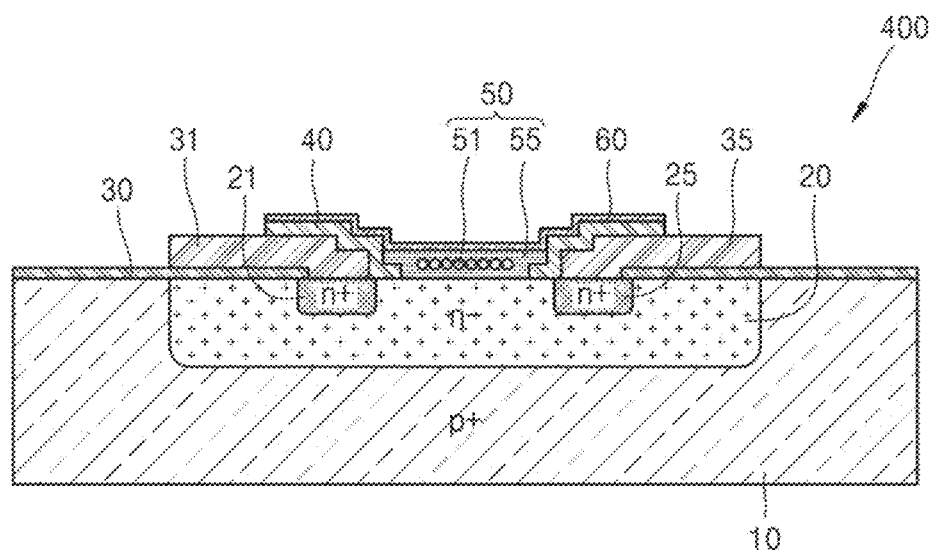
FIG. 6 is a schematic cross-sectional view of a structure of an opto-electronic device according to another example embodiment.

FIG. 6 is a schematic cross-sectional view of a structure of an opto-electronic device 400 according to an example embodiment. The example embodiment of FIG. 6 differs from the example embodiment of FIG. 5 in that a protective layer 60 is further provided on an uppermost portion of a light-receiving region. The protective layer 60 may be formed over the quantum dot layer 50 and the bank structure 40. The protective layer 60 prevents penetration of oxygen $O_2$, moisture $H_2O$, foreign materials, and so on and may be formed of, for example, any one of $Al_2O_3$, $HfO_2$, and $ZrO_2$.

Referring to FIGS. 5 and 6, the first and second semiconductor layers 10 and 20 may be formed such that uppermost surfaces thereof are at the same height.

As such, when the second semiconductor layer 20 is formed by doping with a second conductivity type opposite to a partial region of the first semiconductor layer 10 doped with the first conductivity type, the first and second doped regions 21 and 25 may be formed by doping on the second semiconductor layer 20 to be apart from each other at a different doping concentration from that of the second semiconductor layer 20. In addition, the first electrode 31 and the second electrode 35 may be formed on the second semiconductor layer 20 to be electrically connected to the first and second doped regions 21 and 25. The bank structure 40 may be formed over partial regions of the first and second electrodes 31 and 35 and side surfaces of the first and second electrodes 31 and 35 close to the quantum dot layer 50 and may be formed to contact an upper surface of the second semiconductor layer 20 in a region between the first and second doped regions 21 and 25, and thus the bank structure 40 may block an electrical connection between the quantum dot layer 50 and the first and second doped regions 21 and 25.

In addition, as shown in FIGS. 5 and 6, even when the first and second semiconductor layers 10 and 20 are formed to have uppermost surfaces at the same level, an insulating layer 30 may be further provided on the upper surface of the first semiconductor layer 10, the upper surface of the second semiconductor layer 20 and on portions of upper surfaces of the first and second doped regions 21 and 25. In this case, the first and second electrodes 31 and 35 may be formed on the insulating layer 30 to be electrically connected to the first and second doped regions 21 and 25, respectively.

As such, when the insulating layer 30 is further provided over the first semiconductor layer 10 and the second semiconductor layer 20, due to the presence of the insulating layer 30, the first electrode 31 and the second electrode 35 may form a stepped structure, and the bank structure 40 may be formed to cover a stepped portion of the first and second electrodes 31 and 35.

The opto-electronic devices 100, 200, 300, and 400 of FIGS. 1 to 6 may include the base portion formed to have a pn junction between the first semiconductor layer 10 doped with a first conductivity type and the second semiconductor layer 20 doped with a second conductivity type, thereby having a structure of a junction field-effect transistor (JFET). In this case, the first semiconductor layer 10 serves as a gate, and the second semiconductor layer 20 may correspond to a channel.

In the opto-electronic devices 100, 200, 300, and 400 according to the example embodiments shown in FIGS. 1 to 6, when the first semiconductor layer 10 serving as a gate is doped with, for example, a $p^+$-type and the second semiconductor layer 20 serving as a channel is doped with an $n^-$-type, a current flows between the first doped region 21 and the second doped region 25 through the second semiconductor layer 20 while a gate voltage is not applied to the first semiconductor layer 10. However, when a reverse voltage, that is, a negative voltage, is applied to the first semiconductor layer 10, a depletion region is widened in the second semiconductor layer 20, and thus, the current flowing between the first doped region 21 and the second doped region 25 is reduced. In addition, when a reverse voltage higher than or equal to a certain intensity is applied to the first semiconductor layer 10, the second semiconductor layer 20 is filled with a depletion region, and thus, no current flows between the first doped region 21 and the second doped region 25. Accordingly, the opto-electronic devices 100, 200, 300, and 400 turn on when a voltage is not applied to the first semiconductor layer 10 and turn off when a reverse voltage higher than or equal to a threshold voltage is applied to the first semiconductor layer 10.

In addition, in the opto-electronic devices 100, 200, 300, and 400 according to various example embodiments shown in FIGS. 1 to 6, the quantum dot layer 50 may be an absorption layer for performing photoelectric conversion by absorbing incident light and may be provided between the first and second electrodes 31 and 35 on an upper surface of the base portion. That is, the quantum dot layer 50 may be provided between the first and second electrodes 31 and 35 on the upper surface of the second semiconductor layer 20 of the base portion.

The quantum dot layer 50 may include a plurality of quantum dots 51. The quantum dot layer 50 may be formed of only a plurality of quantum dots 51. In addition, the quantum dot layer 50 may further include an oxide layer 55 on at least one side thereof. That is, the quantum dot layer 50 may be provided where the plurality of quantum dots 51 are arranged to be in contact with an upper surface of the base portion, that is, an upper surface of the second semiconductor layer 20, and the oxide layer 55 may be provided to cover the plurality of quantum dots 51. As another example, the quantum dot layer 50 may be provided where the plurality of quantum dots 51 are in contact with the upper surface of the quantum dot layer 50, and the oxide layer 55 may be provided between the plurality of quantum dots 51 and the upper surface of the base portion, that is, the upper surface of the second semiconductor layer 20. As another example, the quantum dot layer 50 may be provided in a form in which the plurality of quantum dots 51 are surrounded by the oxide layer 55. That is, the oxide layer 55 may be provided between the plurality of quantum dots 51 and the upper surface of the base portion, that is, the upper surface of the second semiconductor layer 20, and the oxide layer 55 may also be provided above the plurality of quantum dots 51 on an upper surface of the quantum dot layer 50.

The plurality of quantum dots 51 may be arranged to form a layer. That is, the quantum dot layer 50 may have a structure that includes a layer in which the plurality of quantum dots 51 are arranged and the oxide layer 55 formed between the layer and an upper surface of the base portion, that is, an upper surface of the second semiconductor layer 20, on an upper portion of the layer, or both sides of the layer. As another example, the plurality of quantum dots 51 may also be dispersed and distributed in the oxide layer 55 constituting the quantum dot layer 50. As such, the plurality of quantum dots 51 may be arranged in various ways within the quantum dot layer 50.

FIGS. 7A to 7D show examples of various arrangements of the plurality of quantum dots 51 in the quantum dot layer 50.

Figure 7A:
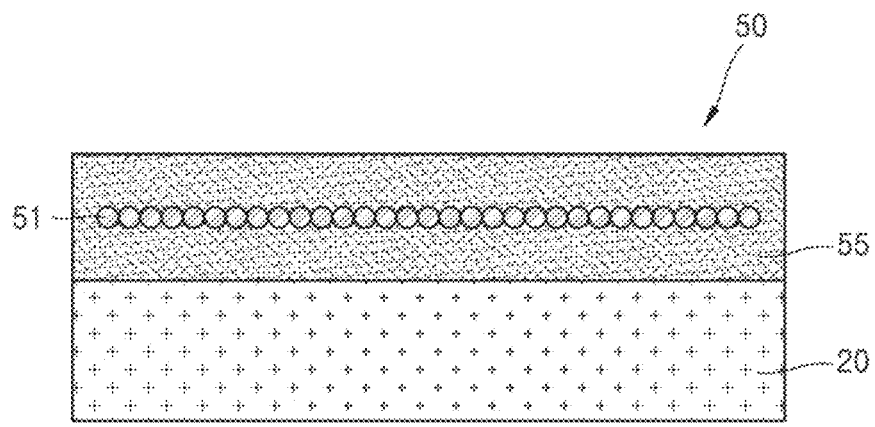
FIGS. 7A to 7D show examples of various arrangements of a plurality of quantum dots in a quantum dot layer.

Referring to FIG. 7A, a plurality of quantum dots 51 may be arranged on a two-dimensional plane as a single layer structure. A planar layer in which the plurality of quantum dots 51 are arranged may be parallel to an upper surface of the second semiconductor layer 20. FIG. 7A shows that the plurality of quantum dots 51 are densely arranged to be in contact with each other, but embodiment are not limited thereto. The plurality of quantum dots 51 may be scattered and distributed and spaced apart from each other in a planar layer in which the plurality of quantum dots 51 are arranged. However, when the number of quantum dots 51 is too small, it is difficult to obtain an amplification effect, and thus, a sufficient number of quantum dots may be arranged. For example, a ratio of an area occupied by the plurality of quantum dots 51 to an area of the two-dimensional plane of the layer in which the plurality of quantum dots 51 are arranged may be greater than or equal to 0.1.

In the example shown in FIG. 7A, the plurality of quantum dots 51 are buried in the oxide layer 55. Accordingly, surfaces of the plurality of quantum dots 51 may be completely surrounded by the oxide layer 55. In addition, the plurality of quantum dots 51 may be not in contact with an upper surface of the second semiconductor layer 20 and an upper surface of the quantum dot layer 50. However, embodiment are not limited thereto.

Figure 7B:
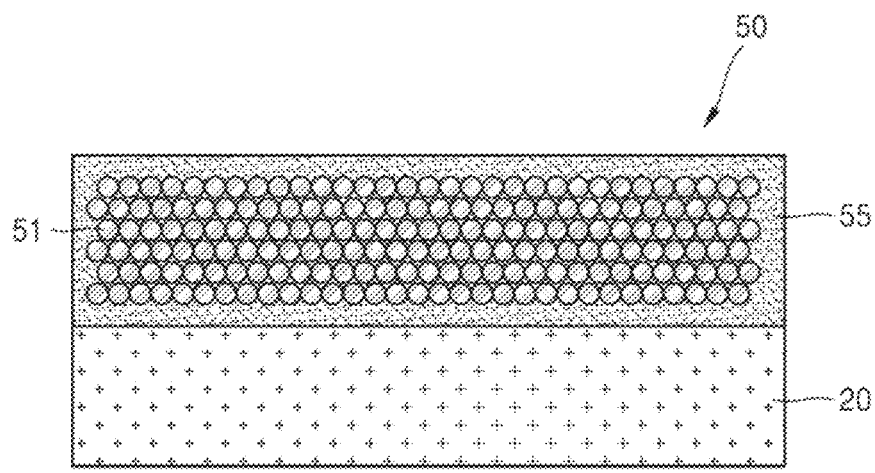

In addition, referring to FIG. 7B, the plurality of quantum dots 51 may also be arranged in a stack structure of a plurality of two-dimensional layers. In this case, the number of quantum dots 51 may increase, and thus, an amplification effect may be further enhanced. However, when the number of layers in which the plurality of quantum dots 51 are stacked is excessively increased, incident light may not reach the bottom. Accordingly, to obtain highest efficiency, the number of layers in which the plurality of quantum dots 51 are stacked may be appropriately selected. For example, the plurality of quantum dots 51 may be stacked in 30 or fewer layers. Alternatively, the plurality of quantum dots 51 may be stacked in 10 or fewer layers. Alternatively, the plurality of quantum dots 51 may be stacked in three or fewer layers.

FIG. 7B shows that, when the plurality of quantum dots 51 are arranged in a stack structure of a plurality of two-dimensional layers, the plurality of quantum dots 51 are stacked without gaps between the layers in which the plurality of quantum dots 51 are arranged, but embodiment are not limited thereto.

Figure 7C:
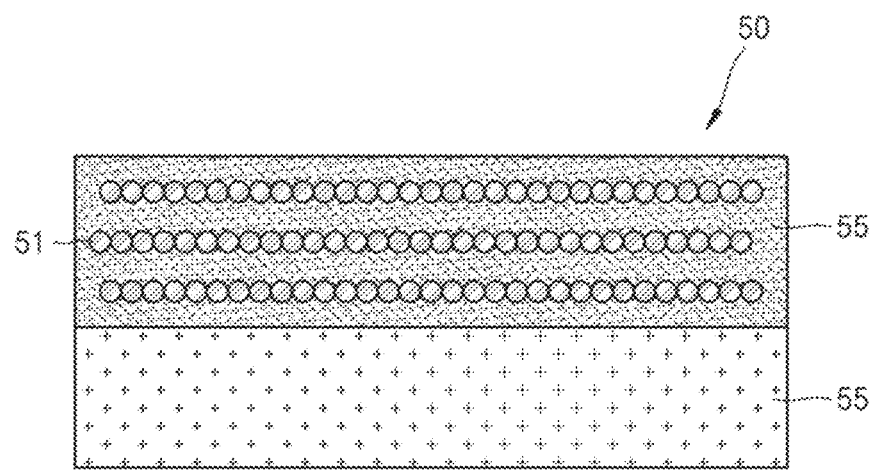

Referring to FIG. 7C, there may be a gap between adjacent two-dimensional layers in which the plurality of quantum dots 51 are arranged. In this case, gaps between the layers in which the plurality of quantum dots 51 are arranged may be filled with the oxide layer 55.

Figure 7D:
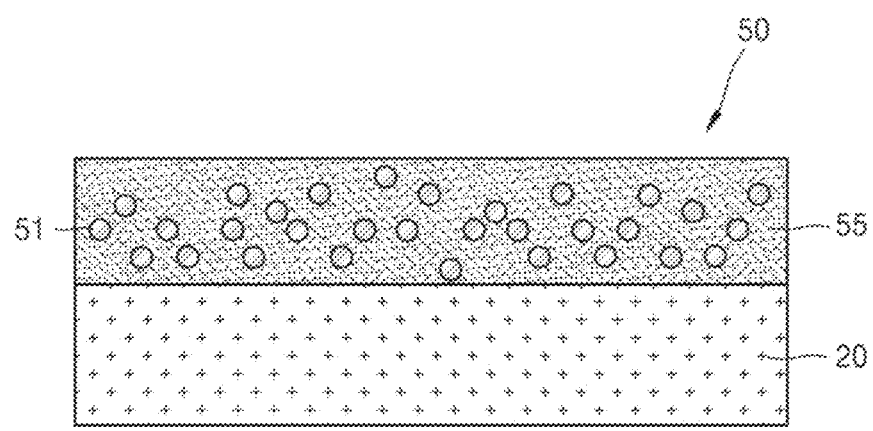

In addition, referring to FIG. 7D, the plurality of quantum dots 51 may also be irregularly distributed and arranged within the oxide layer 55. Accordingly, gaps between the plurality of quantum dots 51 may not be constant.

Figure 8A:
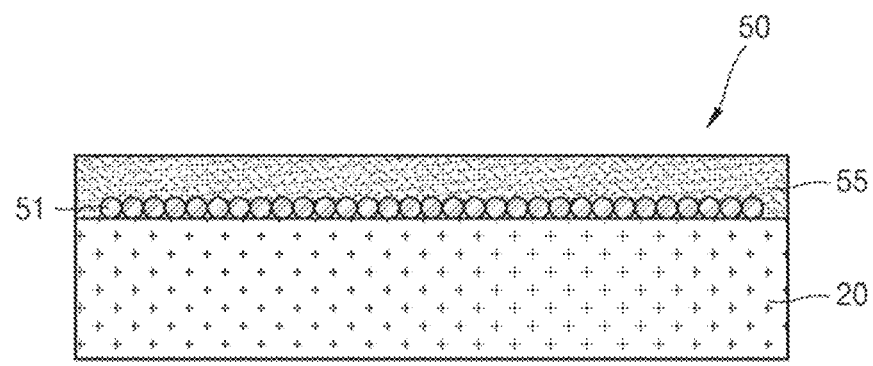
FIGS. 8A and 8B show examples of different arrangements of a plurality of quantum dots in a quantum dot layer.
Figure 8B:
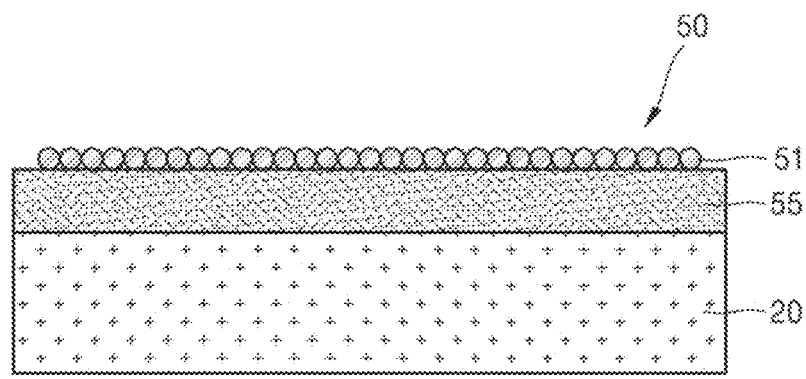

FIGS. 8A and 8B show examples of different arrangements of the plurality of quantum dots 51 in the quantum dot layer 50.

Referring to FIG. 8A, the plurality of quantum dots 51 may be arranged on an upper surface of the second semiconductor layer 20. In this case, lower portions of the plurality of quantum dot 51 may be in contact with the upper surface of the second semiconductor layer 20. The oxide layer 55 may be provided on the second semiconductor layer 20 to cover the plurality of quantum dots 51. The oxide layer 55 may be in contact with side surfaces and upper portions of the plurality of quantum dots 51 and may not be in contact with lower portions of the plurality of quantum dots 51 that are in contact with the second semiconductor layer 20.

In addition, referring to FIG. 8B, the plurality of quantum dots 51 may be arranged on an upper surface of the oxide layer 55. In this case, only the lower portions of the plurality of quantum dots 51 may be in contact with the upper surface of the oxide layer 55.

FIGS. 1, 3, 5, and 6 and drawings of following embodiments show examples in which the quantum dot layer 50 includes a layer in which the plurality of quantum dots 51 are arranged, and the oxide layer 55 surrounding the layer, but the examples are illustrative, and the arrangements of the plurality of quantum dots 51 in the quantum dot layer 50 may be variously modified as described above.

In the opto-electronic devices 100, 200, 300, and 400 according to various embodiments, the oxide layer 55 and the plurality of quantum dots 51 included in the quantum dot layer 50 serve to amplify a photocurrent generated by photons incident on the opto-electronic devices 100, 200, 300, and 400.

The quantum dot 51 may be a particle of a certain size having a quantum confinement effect. For example, the quantum dot 51 may be formed of a compound such as CdSe, CdTe, InP, InAs, InSb, PbSe, PbS, PbTe, AlAs, ZnS, ZnSe, or ZnTe. When light is incident on the quantum dot 51, the quantum dot 51 absorbs the light to generate a photocarrier, that is, a pair of a movable electron and hole. When the photocarrier generated by the quantum dot 51 moves to the second semiconductor layer 20, which is a channel, a photocurrent flows between the first doped region 21 and the second doped region 25. For example, when the second semiconductor layer 20 serving as a channel has an n$^-$-type conductivity, electrons serving as a photocarrier may move to the second semiconductor layer 20.

A wavelength of light absorbed by the quantum dot 51 may change according to a band gap of the quantum dot 51. The band gap of the quantum dot 51 may be mainly determined by a diameter of the quantum dot 51. For example, the quantum dot 51 may have a diameter of about 1 nm to about 10 nm. Accordingly, the diameter of the quantum dot 51 may change according to the wavelength of light to be sensed by the opto-electronic devices 100, 200, 300, and 400. When the opto-electronic device 100, 200, 300, or 400 is configured to detect light of a wide wavelength band, the plurality of quantum dots 51 may have various diameters. In addition, when the opto-electronic device 100, 200, 300, or 400 is configured to detect light of a specific wavelength band, the plurality of quantum dots 51 may have the same diameter.

The oxide layer 55 may serve to transfer efficiently the photocarrier generated by the quantum dot 51 to the second semiconductor layer 20. In particular, the oxide layer 55 may efficiently separate electrons and holes generated by the quantum dots 51 and may transfer the separated electrons or holes to the second semiconductor layer 20. To this end, the oxide layer 55 may be formed to be in contact with each of the plurality of quantum dots 51. In addition, the oxide layer 55 may be formed of a material that is transparent to a wavelength band of light to be detected by the opto-electronic devices 100, 200, 300, and 400 so that incident light may be transferred to the quantum dots 51. The oxide layer 55 may be formed of a transparent oxide semiconductor material. For example, the oxide layer 55 may be formed of a transparent oxide semiconductor material such as silicon indium zinc oxide (SIZO), silicon zinc tin oxide (SZTO), gallium indium zinc oxide (GIZO), indium zinc oxide (IZO), zinc tin oxide (ZTO), indium tin oxide (ITO), $CuAlO_2$, $CuG_2O_2$, $SrCu_2O_2$, or $SnO_2$.

The oxide layer 55 may be formed to have a thin thickness. For example, a thickness of the oxide layer 55 may be about 1 nm to about 100 nm. Alternatively, the thickness of the oxide layer 55 may be about 1 nm to about 50 nm. Alternatively, the thickness of the oxide layer 55 may be about 1 nm to about 30 nm. Because the oxide layer 55 is formed to have a thin thickness, the opto-electronic devices 100, 200, 300, and 400 may have a sufficiently thin thickness.

In the above description, a configuration is described and shown in which the quantum dot layer 50 includes the plurality of quantum dots 51 and the oxide layer 55 in contact with the plurality of quantum dots 51 on at least one side, but embodiments are not limited thereto. For example, in the opto-electronic device 100, 200, 300, or 400 according to the example embodiment, the quantum dot layer 50 may include only an arrangement of the plurality of quantum dots 51 without including the oxide layer 55.

In addition, in the opto-electronic devices 100, 200, 300 and 400 according to various example embodiments, the plurality of quantum dots 51 may be arranged in the form of a thin film by spin-coating or ink-jet-spraying, for example, colloidal quantum dots (CQDs) made by mixing the quantum dots 51 with an organic material such as a solvent. In this case, a layer in which the plurality of quantum dots 51 are uniformly arranged may be obtained by the bank structure 40 that limits a region where the quantum dot layer 50 is formed.

For example, when the quantum dot layer 50 includes an arrangement of the plurality of quantum dots 51 and the oxide layer 55, the oxide layer 55 may be deposited by using a method such as sputtering, and the arrangement of the plurality of quantum dots 51 may be formed by applying CQDs by using a spin coating method or an ink jet spraying method.

For example, when the quantum dot layer 50 has a sandwich stack structure of a two- or three-dimensional arrangement of a plurality of quantum dots 51 sandwiched between two different portions of the oxide layer 55, as shown in FIGS. 7A and 7B, a lower portion of the oxide layer 55 may be deposited on an upper surface of the second semiconductor layer 20 which corresponds to a light-receiving region of the second semiconductor layer 20 and is surrounded by the bank structure 40 by using a method such as sputtering and a two-dimensional arrangement of the plurality of quantum dots 51 may be formed by applying a CQD on the lower portion of the oxide layer 55 by using a spin coating method or an ink jet spraying method. As such, the two-dimensional arrangement of a plurality of quantum dots 51 is formed, and then an upper portion of the oxide layer 55 may be deposited to cover the plurality of quantum dots 51 by using a method such as sputtering, and thus, the quantum dot layer 50 may be formed in a shape in which the plurality of quantum dots 51 are surrounded by the oxide layer 55.

In addition, when the quantum dot layer 50 has a structure in which the plurality of quantum dots 51 are located at a plurality of heights and the oxide layer 55 is between quantum dots located at different heights as shown in FIGS. 7C and 7D, the quantum dot layer 50 may be formed by alternately performing a process of applying the quantum dots 51 and a process of depositing the oxide layer 55.

In addition, when the quantum dot layer 50 is formed so that the plurality of quantum dots 51 are in contact with an upper surface of the base portion, that is, an upper surface of the second semiconductor layer 20, and the oxide layer 55 covers the plurality of quantum dots 51, as shown in FIG. 8A, the quantum dot layer may be formed by forming an arrangement of the plurality of quantum dots 51 through a process of applying the quantum dots 51 and depositing the oxide layer 55 on the arrangement.

In addition, when the quantum dot layer 50 is formed to have a structure in which the plurality of quantum dots 51 are arranged at the uppermost surface of the quantum dot layer 50, as shown in FIG. 8B, the quantum dot layer may be formed by depositing the oxide layer 55 on the upper surface of the base portion, that is, the upper surface of the second semiconductor layer 20, and by applying the plurality of quantum dots 51 on the oxide layer 55 to form an arrangement of the plurality of quantum dots 51.

In addition, when the quantum dot layer 50 includes only a two-dimensional arrangement of the plurality of quantum dots 51, an arrangement of the plurality of quantum dots 51 may be formed by applying the plurality of quantum dots 51 on the upper surface of the base portion, that is, the upper surface of the second semiconductor layer 20.

In the opto-electronic devices 100, 200, 300, and 400 having a structure of a junction-type field effect transistor described above, a current flowing between the first doped region 21 and the second doped region 25 may be controlled by adjusting a voltage applied to the first semiconductor layer 10 to adjust an area of a depletion region in the second semiconductor layer 20. Accordingly, dark noise generated by a current flowing between the first doped region 21 and the second doped region 25 when no light is incident on the opto-electronic device 100, 200, 300, or 400 may be prevented or reduced. Accordingly, signal-to-noise ratios of the opto-electronic devices 100, 200, 300, and 400 may be improved.

In addition, the opto-electronic devices 100, 200, 300, and 400 may be easily turned on or turned off by adjusting a voltage applied to the first semiconductor layer 10, and thus, a switching operation of outputting a photocurrent from the opto-electronic device 100, 200, 300, or 400 may be performed by turning the opto-electronic device 100, 200, 300, or 400 on only when a signal output is required.

In addition, more photocarriers than photons incident on the opto-electronic devices 100, 200, 300, and 400 per unit time may be generated by using the plurality of quantum dots 51 and the oxide layer 55 arranged on the second semiconductor layer 20 serving as a channel, and thus, the opto-electronic devices 100, 200, 300, and 400 may obtain a gain greater than 1. Accordingly, an amplification effect of an output signal is obtained by the oxide layer 55 and the plurality of quantum dots 51, and thus, signal-to-noise ratios of the opto-electronic devices 100, 200, 300, and 400 may be further increased. Accordingly, when the opto-electronic devices 100, 200, 300, and 400 according to the present example embodiment are used, a clear image may be obtained even with weak incident light.

The example embodiments described with reference to FIGS. 1 to 6 describe and show that the first semiconductor layer 10 is doped with a p$^+$-type and the second semiconductor layer 20 is doped with an n$^-$-type, but embodiments are not limited thereto. For example, in the opto-electronic device 100, 200, 300, or 400 according to the example embodiment, the first semiconductor layer 10 may be doped with an n$^+$-type of a high concentration, and the second semiconductor layer 20 may be doped with a p$^-$-type of a low concentration. In this case, because the second semiconductor layer 20 serving as a channel has a p$^-$-type conductivity, when light is incident on the plurality of quantum dots 51, holes serving as photocarriers may move from the plurality of quantum dots 51 to the second semiconductor layer 20.

As such, in the opto-electronic devices 100, 200, 300, and 400 according to the example embodiments, the first semiconductor layer 10 and the second semiconductor layer 20 may be doped with an opposite conductivity type, thereby forming a pn junction. The first semiconductor layer 10 may have a p-type conductivity and the second semiconductor layer 20 may have an n-type conductivity, or the first semiconductor layer 10 may have an n-type conductivity and the second semiconductor layer 20 may have a p-type conductivity. In addition, the first semiconductor layer 10 serving as a gate may be doped with a high concentration, and the second semiconductor layer 20 serving as a channel may be doped with a low concentration. However, when the second semiconductor layer 20 serving as a channel has an n-type conductivity, charge carriers of the channel are electrons, and when the second semiconductor layer 20 serving as a channel has a p-type conductivity, charge carriers of the channel are holes. Because mobility of electrons is higher than mobility of holes, the performance of the opto-electronic device 100, 200, 300, or 400 may be higher in an n-type channel than in a p-type channel.

In addition, although example embodiments of the opto-electronic devices 100, 200, 300, and 400 having a JFET structure are described and shown above, embodiments are not limited thereto. For example, the opto-electronic devices according to the embodiments may also be formed to have field effect transistor structures shown in FIGS. 9A and 9B and FIGS. 10A and 10B.

Figure 9A:
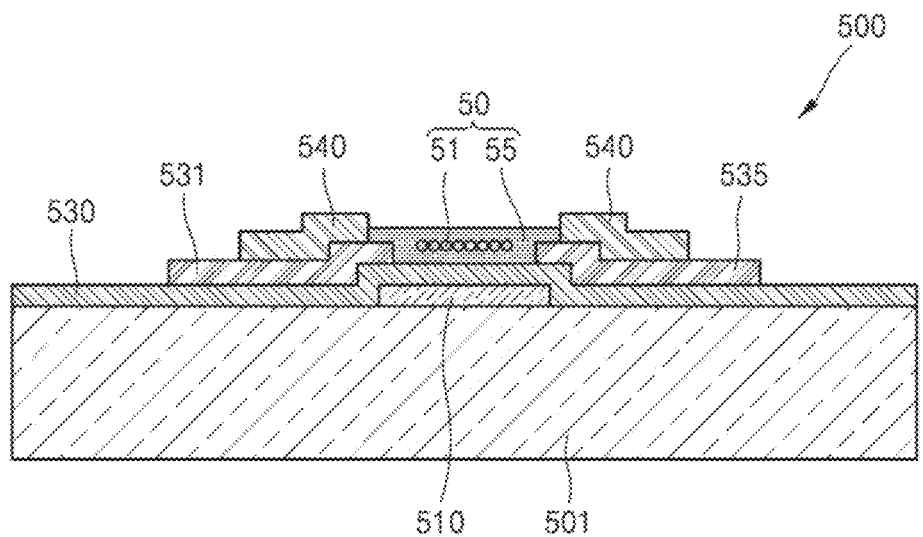
FIG. 9A is a schematic cross-sectional view of a structure of an opto-electronic device according to an example embodiment.
Figure 9B:
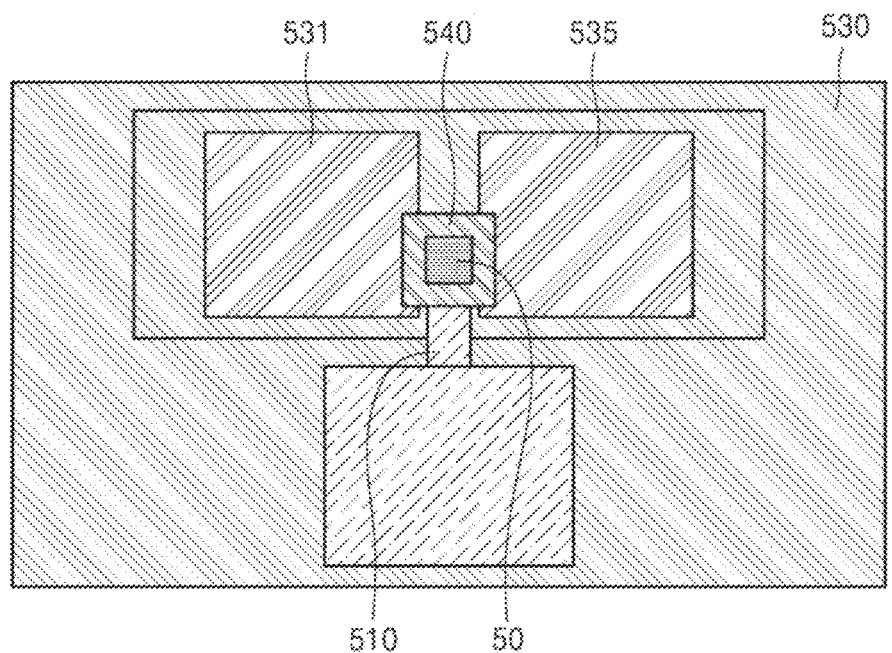
FIG. 9B is an example of a plan view of FIG. 9A.

FIG. 9A is a schematic cross-sectional view showing a structure of an opto-electronic device 500 according to an example embodiment, and FIG. 9B shows an example of a plan view of FIG. 9A.

Referring to FIGS. 9A and 9B, the opto-electronic device 500 according to the example embodiment is a field effect transistor (FET) type and may include a base portion, first and second electrodes 531 and 535 formed on the base portion to be apart from each other, a quantum dot layer 50 between the first electrode 531 and the second electrode 535 on the base portion, and a bank structure 540 which is formed to cover at least partial regions of the first and second electrodes 531 and 535, limits a region where the quantum dot layer 50 is formed, and is formed of an inorganic material. In an example embodiment, the base portion may include a substrate 501, a gate 510 formed on the substrate 501 to have a certain width, and an insulating layer 530 formed on the substrate 501.

The substrate 501 may include various substrates such as a glass substrate, an Si substrate, a Ge substrate, and a compound semiconductor substrate.

The gate 510 may be positioned below and between the first electrode and the second electrode, The gate 510 may be formed of a metal material such as Al, AlN, Ti, TiN, Mo, Pt, Au, Cr, Ni, or Cu. The insulating layer 530 may be formed of, for example, any one of $SiO_2$, $Si_3N_4$, $Al_2O_3$, and $HfO_2$.

The first and second electrodes 531 and 535 may be formed on the insulating layer 530 to be electrically connected to the quantum dot layer 50. The first electrode 531 and the second electrode 535 may be formed on the insulating layer 530 to be apart from each other and to extend to both sides of the gate 510 with the quantum dot layer 50 therebetween. In other words, the first electrode 531 may extend on a first side of the gate 510 and the second electrode 535 may extend on a second side of the gate 510 opposite to the first side. For example, the first and second electrodes 531 and 535 may be formed of a metal material such as Al, AlN, Ti, TiN, Mo, Pt, Au, Cr, Ni, or Cu. Between the first electrode 531 and the second electrode 535, one may be a source electrode and the other may be a drain electrode.

The bank structure 540 may be formed to limit a region of the quantum dot layer 50 on the first and second electrodes 531 and 535. The bank structure 540 may be formed to cover at least partial regions of the first and second electrodes 531 and 535 to limit the region where the quantum dot layer 50 is formed. In addition, the bank structure 540 may be formed to limit the region where the quantum dot layer 50 is formed by forming an uppermost surface to be higher than an upper surface of a light-receiving region including the quantum dot layer 50. The bank structure 540 may be an insulator and may be formed of, for example, inorganic oxide. The bank structure 540 may be formed of, for example, any one of $SiO_2$, $Si_3N_4$, $Al_2O_3$, and $HfO_2$.

As described above, the bank structure 540 may be formed in a split type so that stripes are on both sides of the quantum dot layer 50 or may be formed in a ring structure surrounding the quantum dot layer 50. For example, the bank structure 540 may be formed in a rectangular ring structure. FIG. 9B shows an example in which the bank structure 540 is formed in a rectangular ring structure.

The quantum dot layer 50 may be formed at a position corresponding to the gate 510 between the first electrode 531 and the second electrode 535. The quantum dot layer 50 may include a plurality of quantum dots 51. The quantum dot layer 50 may also be formed of only the plurality of quantum dots 51. In addition, the quantum dot layer 50 may further include an oxide layer 55 on at least one side of the plurality of quantum dots 51. That is, the quantum dot layer 50 may be provided where the plurality of quantum dots 51 are arranged to be in contact with an upper surface of the base portion, that is, an upper surface of the second semiconductor layer 20, and the oxide layer 55 covers the plurality of quantum dots 51. As another example, the quantum dot layer 50 may be provided where the plurality of quantum dots 51 are in contact with the upper surface of the quantum dot layer 50, and the oxide layer 55 is provided between the plurality of quantum dots 51 and the upper surface of the base portion, that is, the upper surface of the second semiconductor layer 20. As another example, the quantum dot layer 50 may be provided in a form in which the plurality of quantum dots 51 are surrounded by the oxide layer 55. That is, the oxide layer 55 may be provided between the plurality of quantum dots 51 and the upper surface of the base portion, that is, the upper surface of the second semiconductor layer 20, and the oxide layer 55 may also be provided on an upper end of the quantum dot layer 50. Various configurations of the quantum dot layer 50 and a method of forming the quantum dot layer 50 may be the same as described above, and repetitive descriptions thereon are omitted.

Figure 10A:
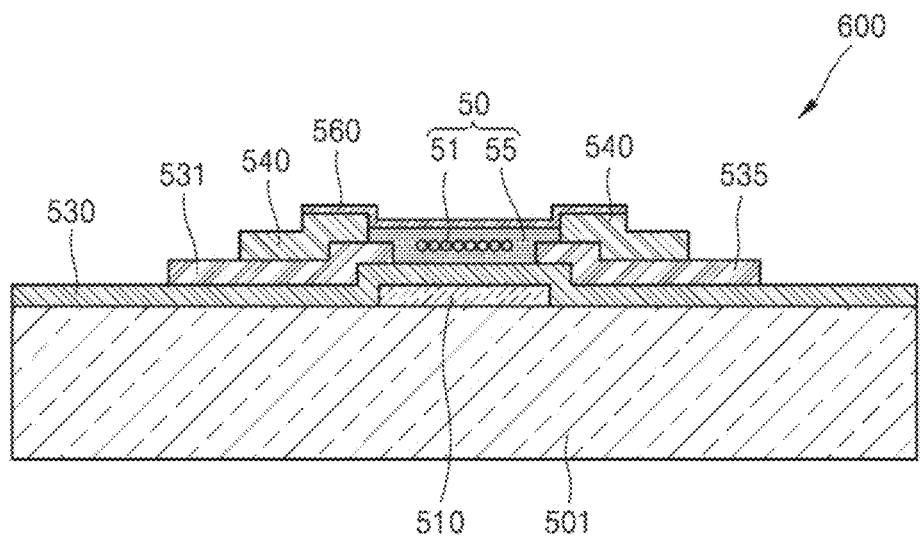
FIG. 10A is a schematic cross-sectional view of a structure of an opto-electronic device according to an example embodiment.
Figure 10B:
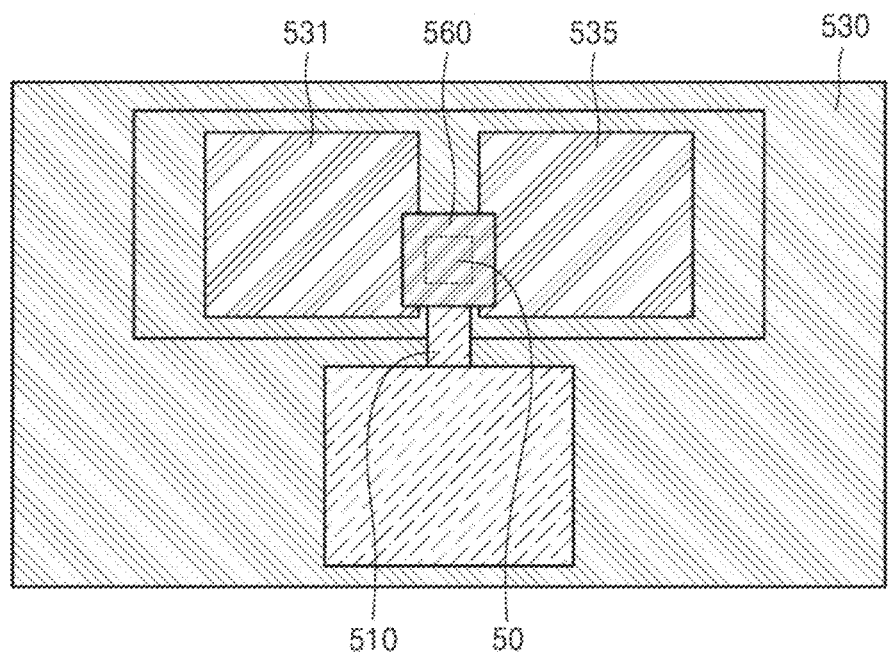
FIG. 10B is an example of a plan view of FIG. 10A.

FIG. 10A is a schematic cross-sectional view of a structure of an opto-electronic device 600 according to an example embodiment. FIG. 10B is an example of a plan view of FIG. 10A. Example embodiments of FIGS. 10A and 10B differ from the example embodiments of FIGS. 9A and 9B in that a protective layer 560 is further provided on an uppermost portion of the light-receiving region. The protective layer 560 may be formed over the quantum dot layer 50 and the bank structure 540. The protective layer 560 may stably protect the quantum dot layer 50 by preventing penetration of oxygen ($O_2$), moisture ($H_2O$), foreign materials, and so on. For example, the protective layer 560 may be formed of any one of insulating materials such as $Al_2O_3$, $HfO_2$, and $ZrO_2$. The protective layer 560 may be formed by, for example, an ALD method. The protective layer 560 may also be formed of a material such as $SiO_2$.

Hereinafter, examples of various samples in which the opto-electronic device according to the example embodiment is formed to have a JFET structure will be described.

Figure 11A:
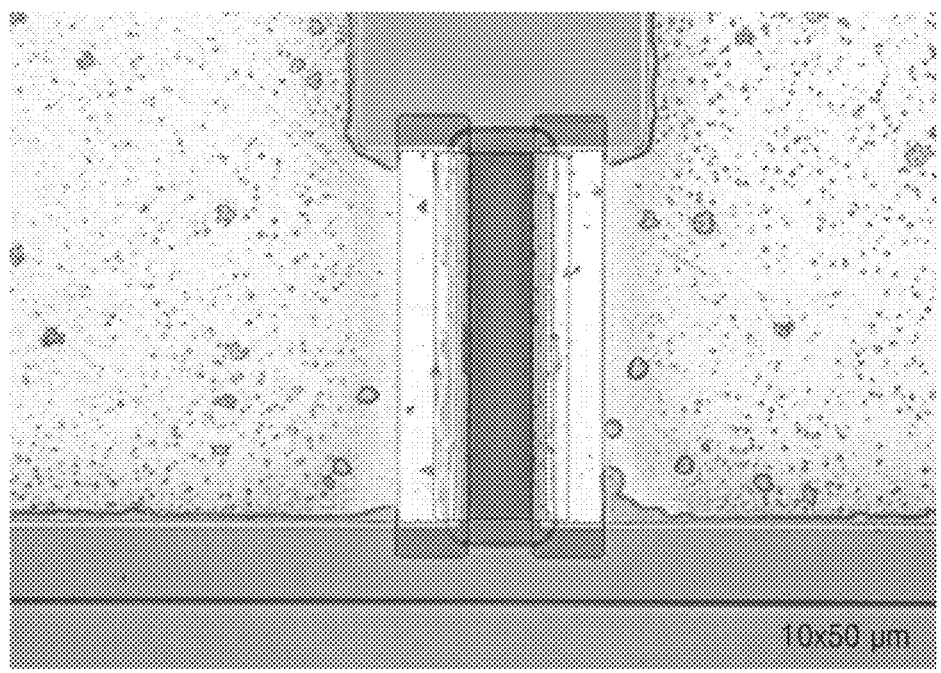
FIG. 11A shows a schematic top view of an opto-electronic device to which a split-type bank structure is applied when an effective quantum dot layer is formed to have a size of about 10×50 μm.
Figure 11B:
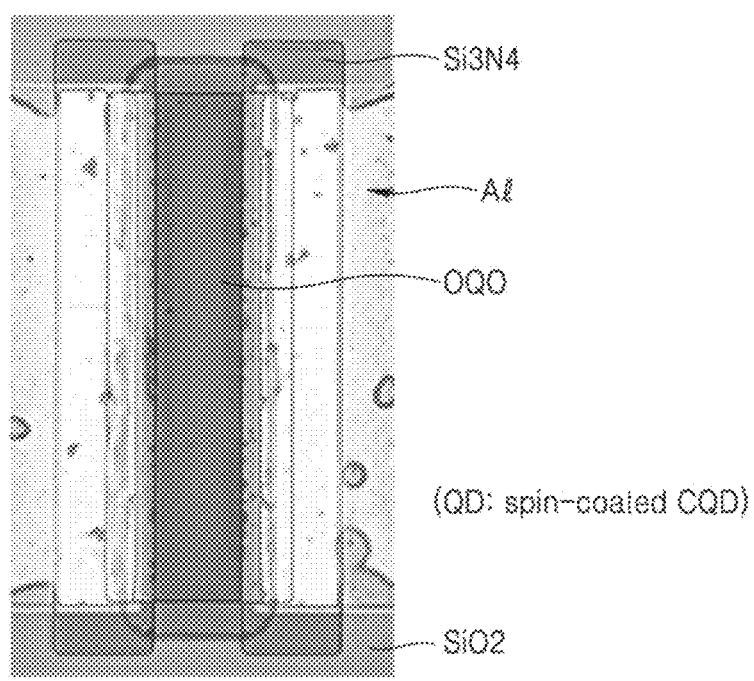
FIG. 11B is an enlarged view of a main portion of FIG. 11A.
Figure 12A:
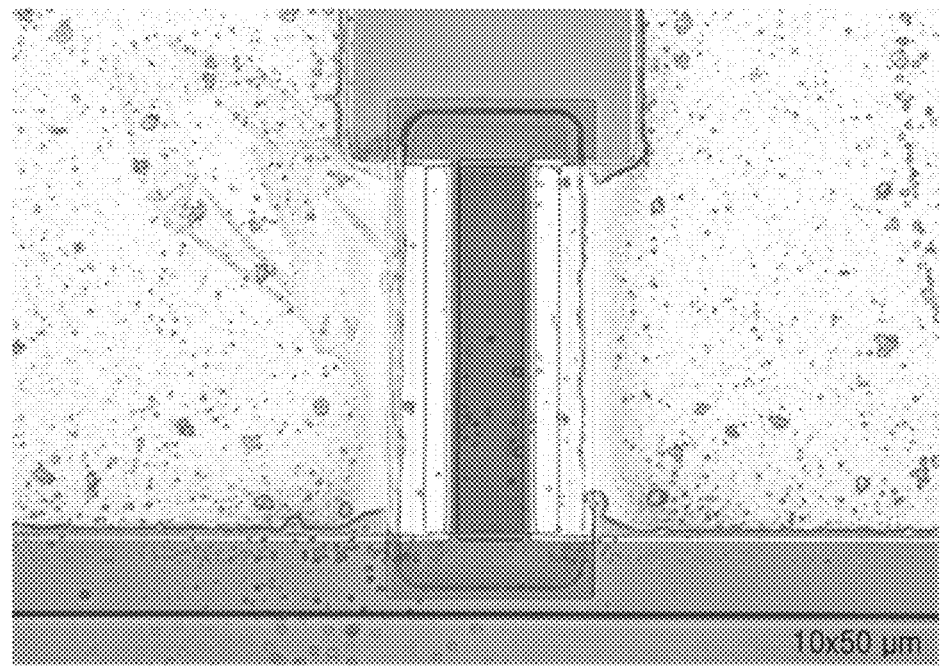
FIG. 12A shows a schematic top view of an opto-electronic device to which a rectangular ring-shaped bank structure is applied when an effective quantum dot layer is formed to have a size of about 10×50 μm.
Figure 12B:
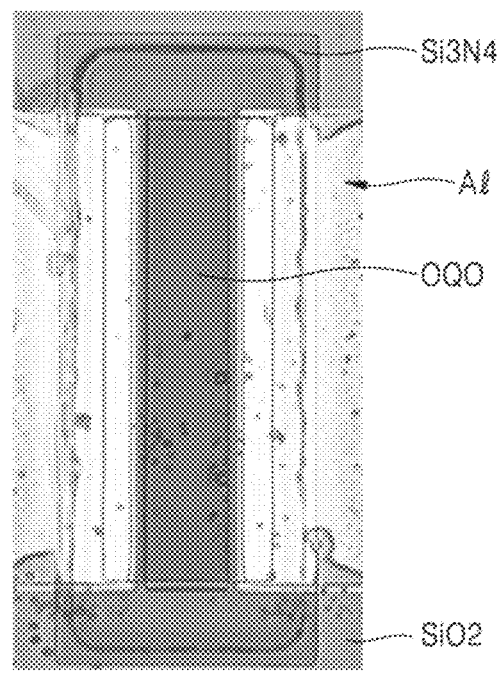
FIG. 12B is an enlarged view of a main portion of FIG. 12A.
Figure 13A:
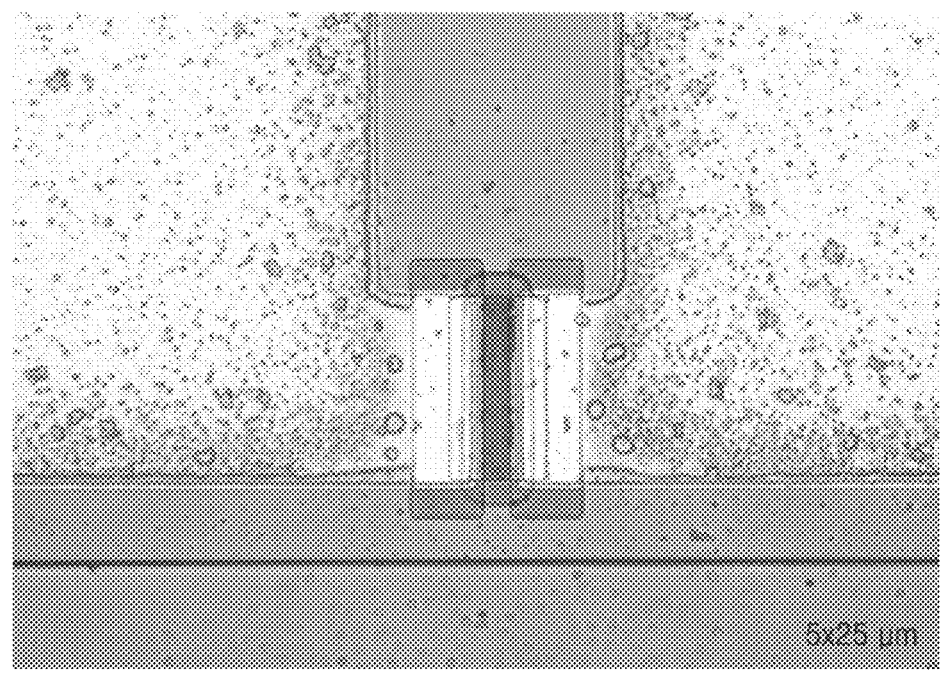
FIGS. 13A and 13B and FIGS. 14A and 14B show a difference between a split bank structure between a source and a drain and an oxide-quantum dot-oxide (OQO)-surrounded square bank-applied structure when an effective quantum dot layer is formed to have a size of about 5×25 μm.
Figure 13B:
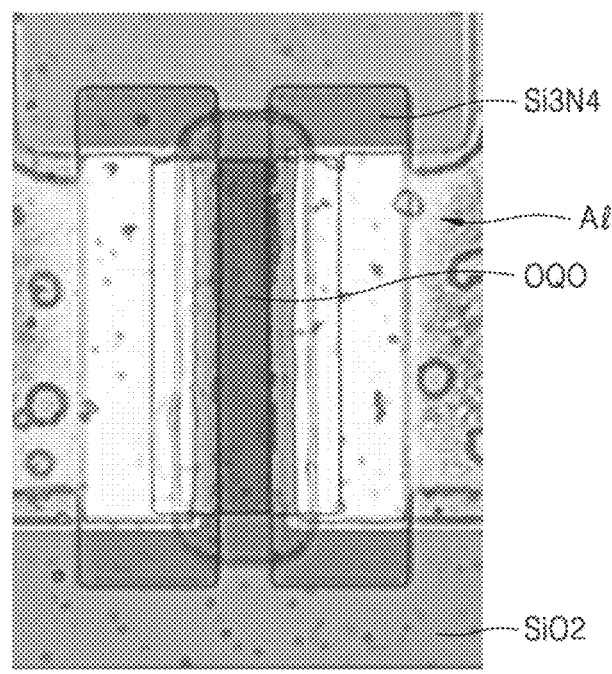
Figure 14A:
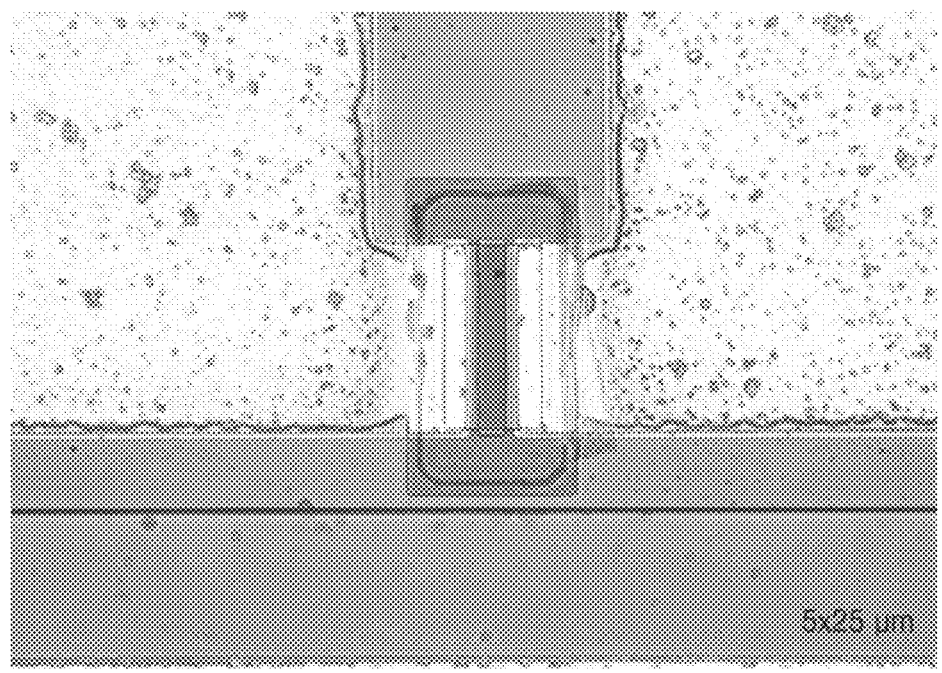
Figure 14B:
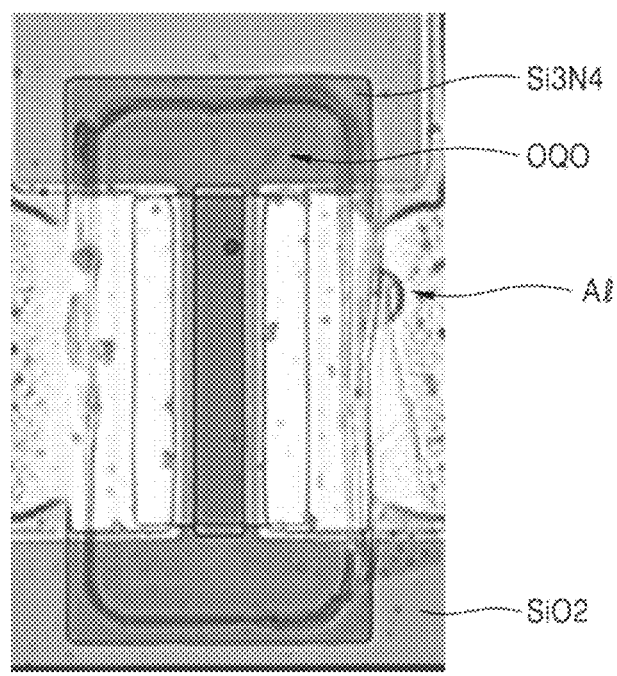
Figure 15A:
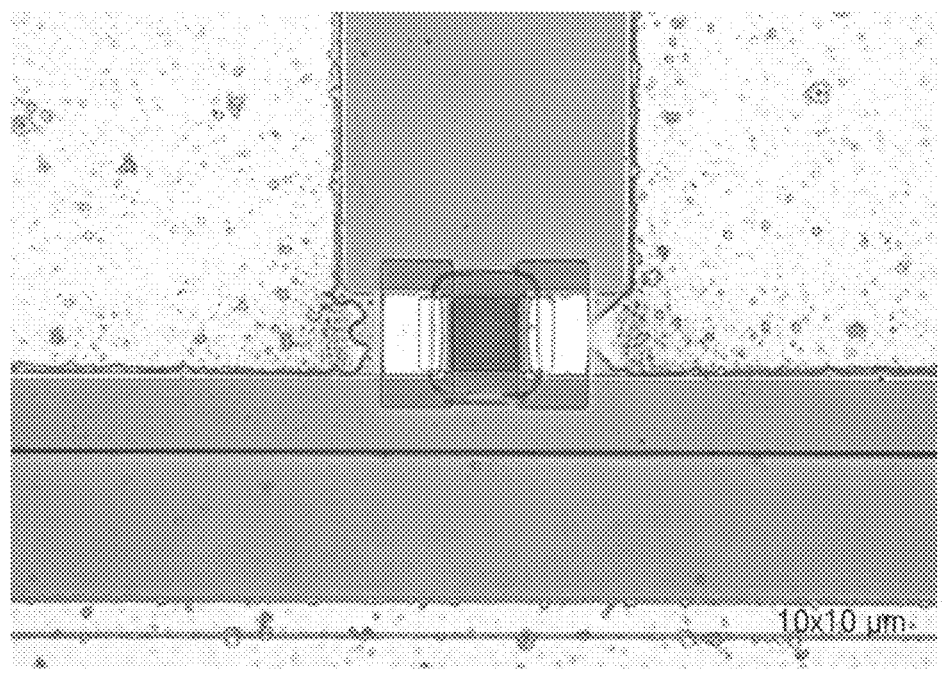
FIGS. 15A and 15B and FIGS. 16A and 16B show a difference between a split-type bank structure between a source and a drain and an OQO-surrounded square bank-applied structure when an effective quantum dot layer is formed in an approximately square shape having a size of about 10×10 μm.
Figure 15B:
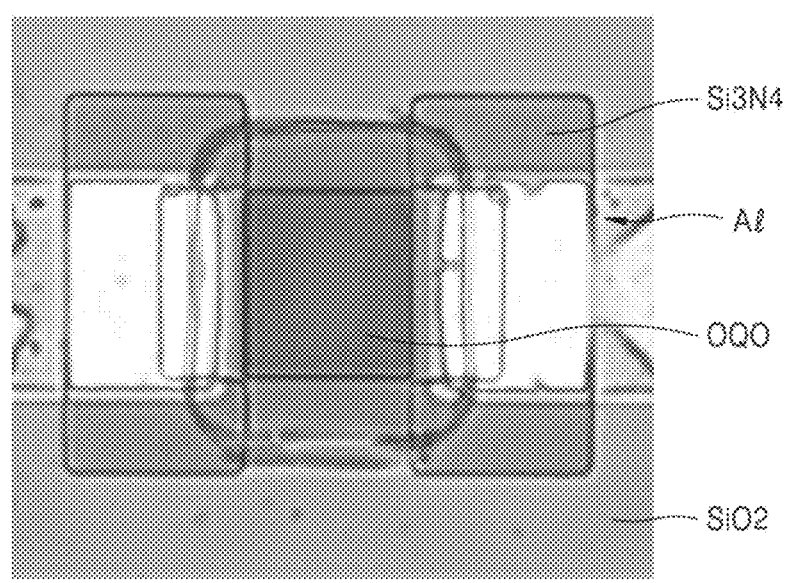
Figure 16A:
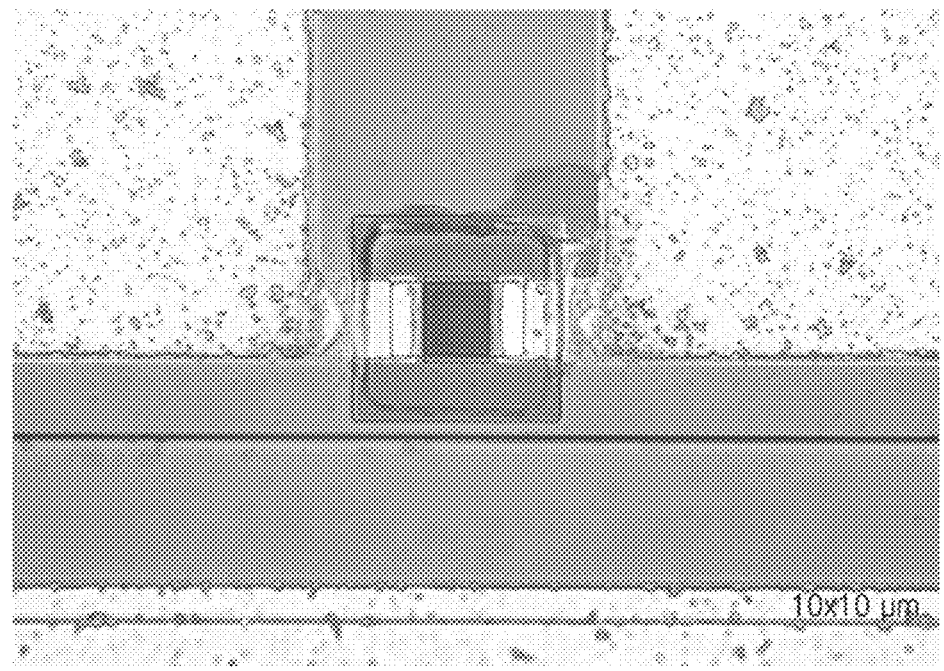
Figure 16B:
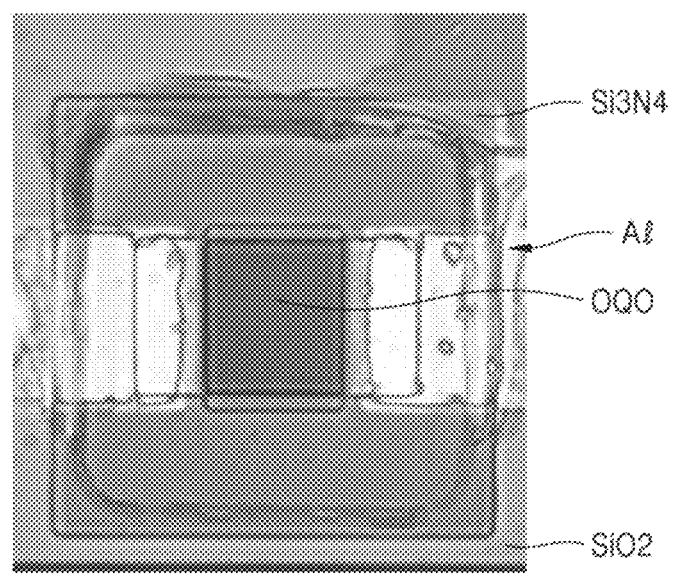
Figure 17A:
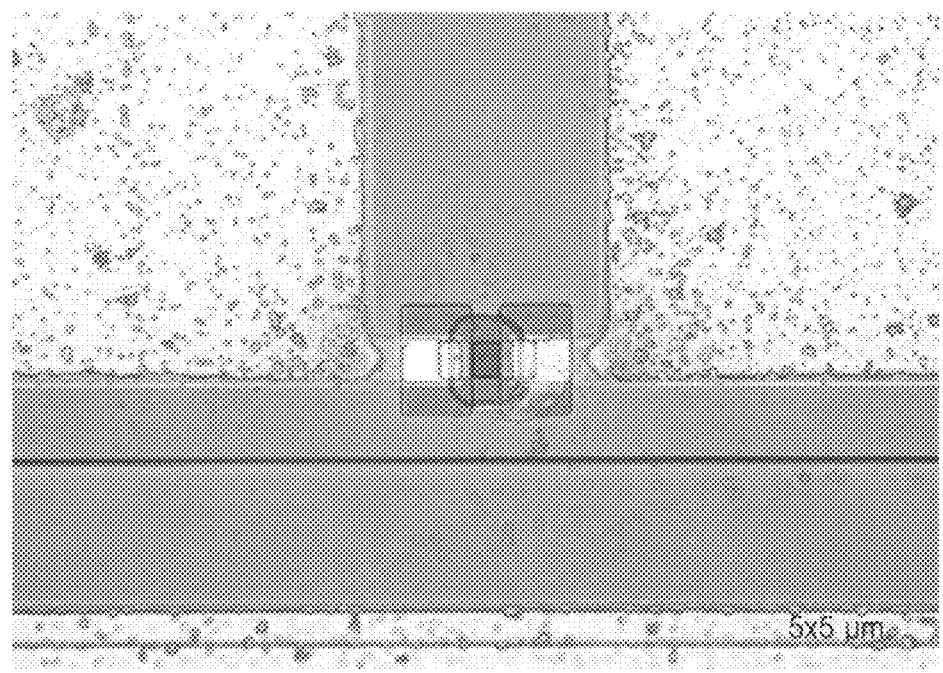
FIGS. 17A and 17B and FIGS. 18A and 18B show a difference between a split-type bank structure between a source and a drain and an OQO-surrounded square bank-applied structure when an effective quantum dot layer is formed in an approximately square shape having a size of about 5×5 μm.
Figure 17B:
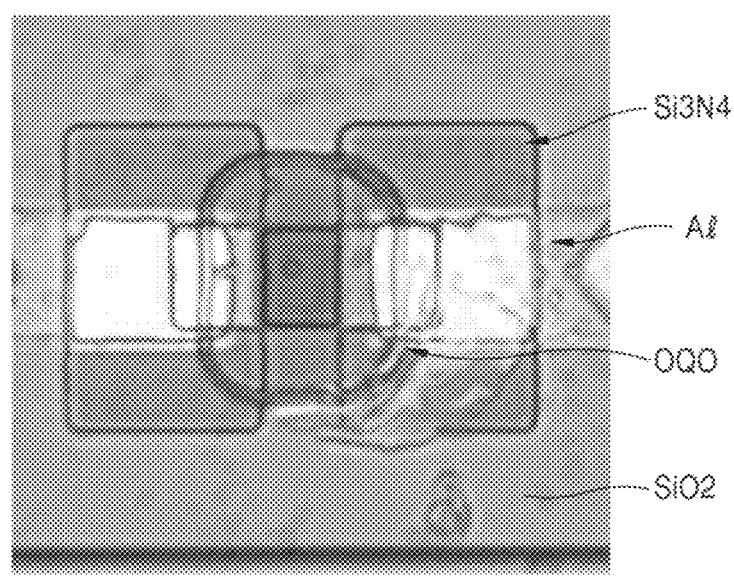
Figure 18A:
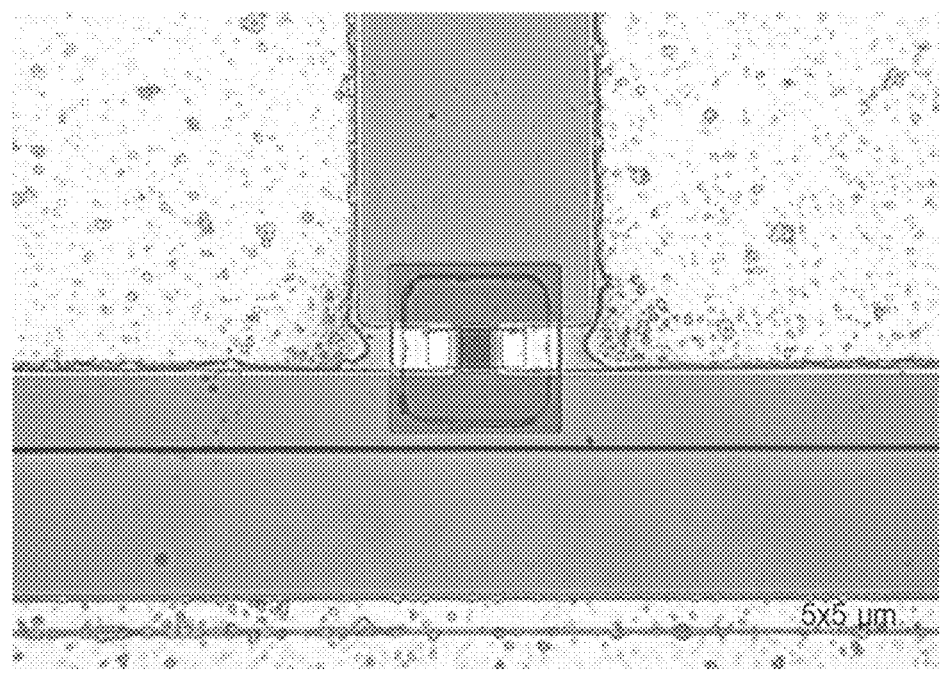
Figure 18B:
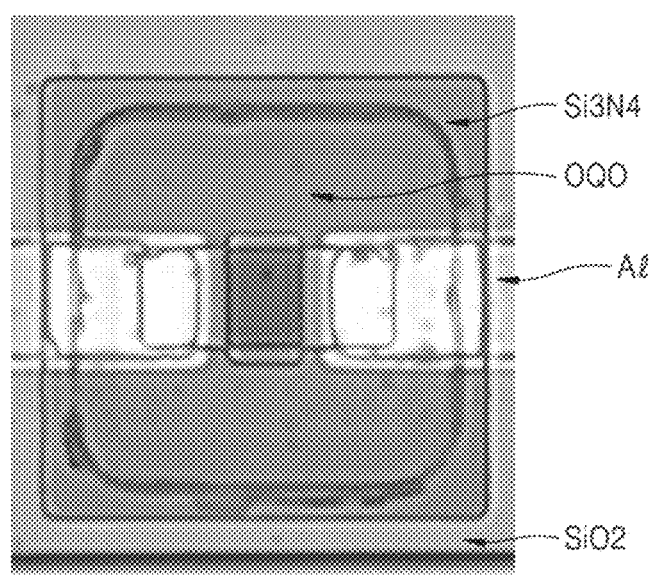
Figure 19A:
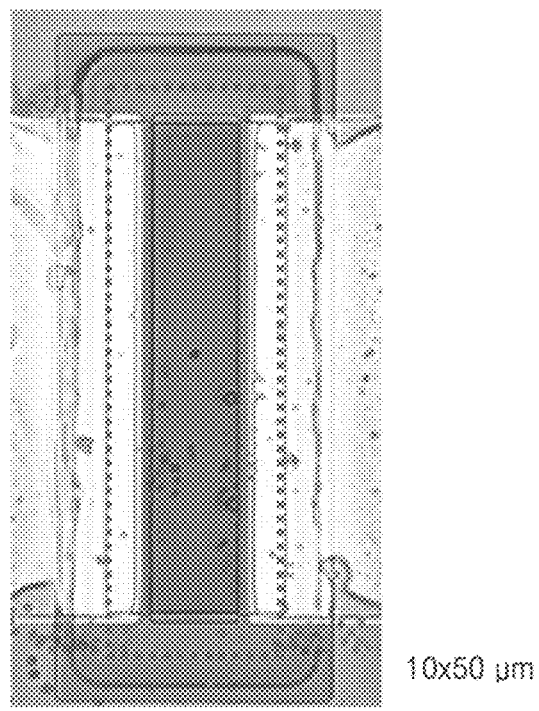
FIGS. 19A to 19D show quantum dot layers to be left after an unnecessary quantum dot layer (OQO) of an outer periphery is etched as a subsequent process for the OQO-surrounded square bank-applied structures of FIGS. 12B, 14B, 16B, and 18B, respectively.
Figure 19B:
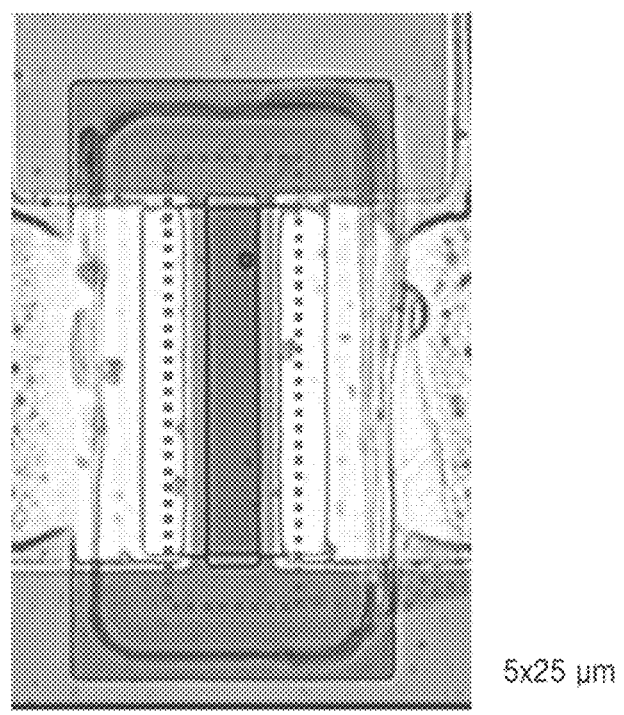
Figure 19C:
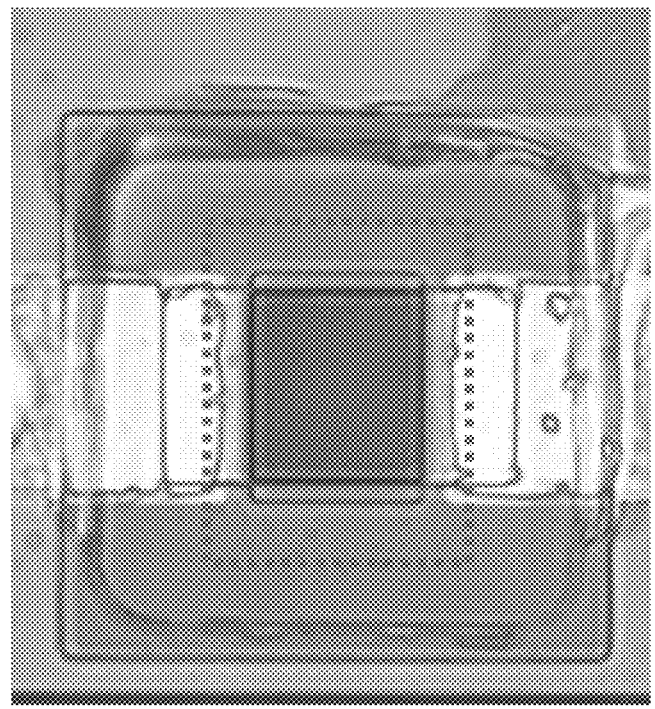
Figure 19D:
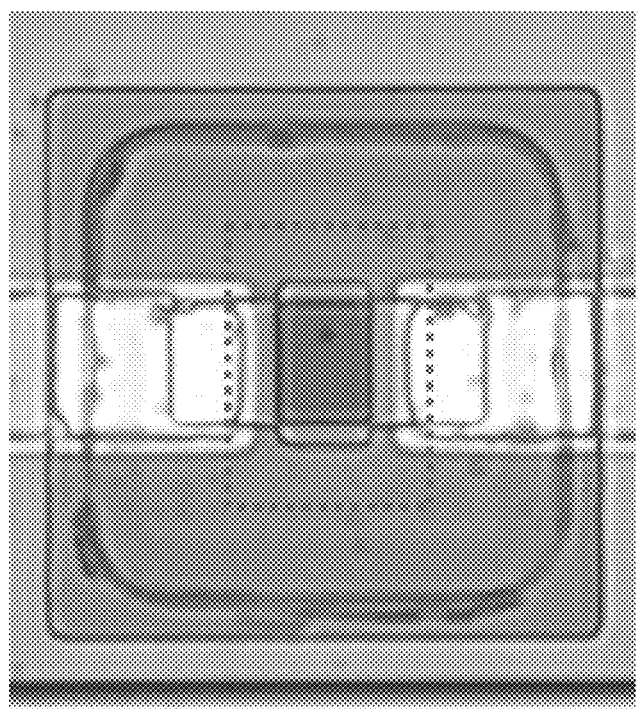

FIG. 11A a schematic top view of an opto-electronic device to which a split-type bank structure is applied, and FIG. 11B is an enlarged view of a main portion of FIG. 11A. FIG. 12A shows a schematic top view of an opto-electronic device to which a rectangular ring-shaped bank structure is applied, and FIG. 12B is an enlarged view of a main portion of FIG. 12A. FIGS. 11A and 11B, and FIGS. 12A and 12B show examples in which an effective quantum dot layer is formed to have a size of about 10×50 µm. In FIGS. 11A and 11B and FIGS. 12A and 12B, a size of 10×50 µm of an effective quantum dot layer may correspond to a size of a channel region.

FIGS. 11A and 11B, and 12A and 12B show examples in which an $SiO_2$ layer is formed as an insulating layer, patterns for a channel and electrodes are formed on the $SiO_2$ layer, and then first and second electrodes are formed, and then a bank structure pattern is formed by using $Si_3N_4$ so that the first and second electrodes are not in direct contact with a quantum dot layer, and then a quantum dot layer (oxide-quantum dot-oxide: OQO) having a stack structure of an arrangement of a plurality of quantum dots sandwiched between oxide layers is formed on the bank structure pattern. Not only an $Si_3N_4$ material but also an insulator such as $SiO_2$ may be used to form a bank structure. The quantum dot layer (OQO) may be formed, for example, by depositing an oxide layer and spin-coating a CQD, and then performing lift-off or etching. As can be seen from a comparison between FIGS. 11A and 11B and FIGS. 12A and 12B, uniformity of the quantum dot layer (OQO) provided on an upper portion of a central channel region is better in an applied structure of rectangular bank surrounding the quantum dot layer (OQO) (OQO-surrounded rectangular bank) than in a split bank structure between first and second doped regions, that is, a source and a drain.

FIGS. 13A and 13B, 14A and 14B show a difference between the split bank structure between the source and the drain and the OQO-surrounded square bank-applied structure and show examples in which a size of an effective quantum dot layer, that is, a channel region is about 5×25 µm, compared to FIGS. 11A and 11B and FIGS. 12A and 12B.

As can be seen from a comparison between FIGS. 13A and 13B and FIGS. 14A and 14B, even when a size of a channel region is about 5×25 µm, uniformity of a quantum dot layer (OQO) provided on an upper portion of a central channel layer is better in the OQO-surrounded rectangular bank-applied structure than in a split bank structure between a source and a drain.

FIGS. 15A and 15B and FIGS. 16A and 16B show a difference between a split bank structure between a source and a drain and an OQO-surrounded square bank-applied structure and show examples in which an effective quantum dot layer, that is, a channel region has an approximately square shape with a size of about 10×10 µm, compared to FIGS. 11A and 11B and FIGS. 12A and 12B. In addition, FIGS. 17A and 17B and FIGS. 18A and 18B show a difference between a split bank structure between a source and a drain and an OQO-surrounded square bank-applied structure and show examples in which an effective quantum dot layer, that is, a channel region has an approximately square shape with a size of about 5×5 µm, compared to FIGS. 11A and 11B and FIGS. 12A and 12B.

As can be seen from a comparison between FIGS. 15A and 15B and FIGS. 16A and 16B, and a comparison between FIGS. 17A and 17B and FIGS. 18A and 18B, even when the channel regions are formed to have square shapes with sizes of about 10×10 µm and 5×5 µm, respectively, uniformity of a quantum dot layer (OQO) provided on an upper portion of a central channel layer is better in the OQO-surrounded square bank-applied structure than in the split bank structure between the source and the drain.

FIGS. 19A to 19D show portions of quantum dot layers remained after an unnecessary portion of quantum dot layer (OQO) of an outer periphery is etched as a subsequent process for the OQO-surrounded rectangular bank-applied structures of FIGS. 12B, 14B, 16B, and 18B, respectively. In FIGS. 19A to 19D, portions denoted by dotted lines are the portions of the quantum dot layers remaining after the unnecessary quantum dot layer (OQO) of the outer periphery is etched as a subsequent process and corresponds to an effective light-receiving region.

Figure 20A:
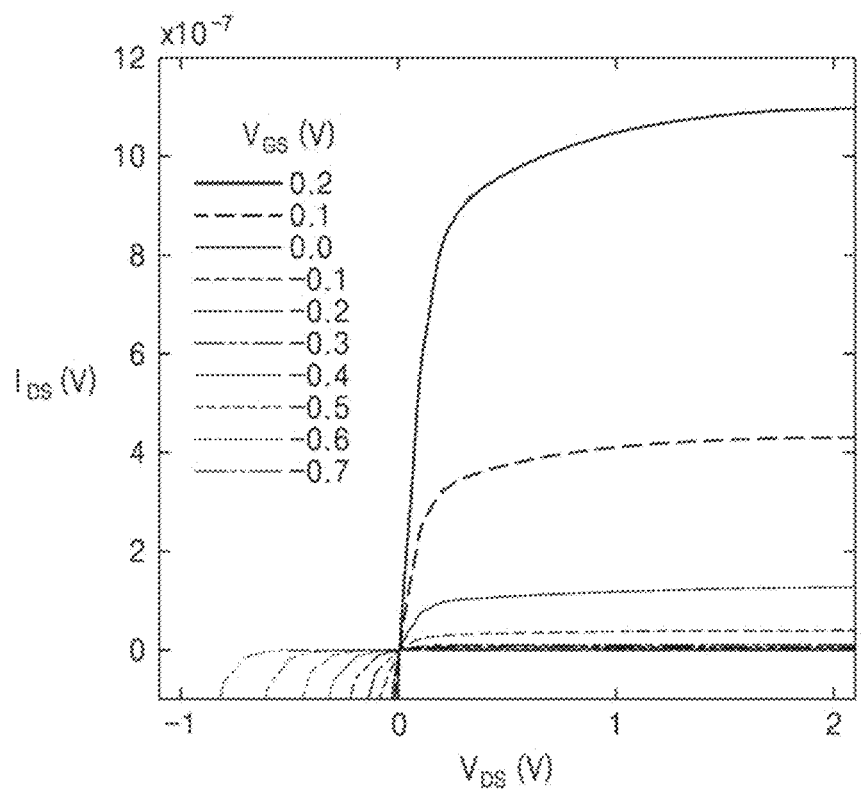
FIGS. 20A and 20B show I-V characteristics of an opto-electronic device sample according to an example embodiment in a dark state, which includes a channel region having a size of about 50×50 μm and has a JFET (junction field-effect transistor) structure.
Figure 20B:
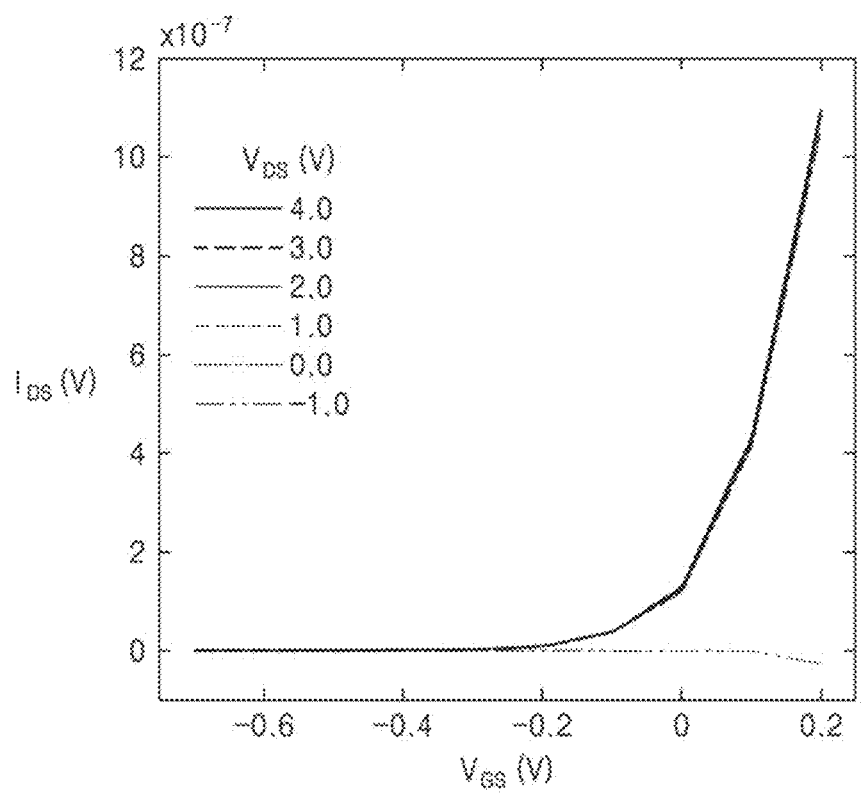
Figure 21A:
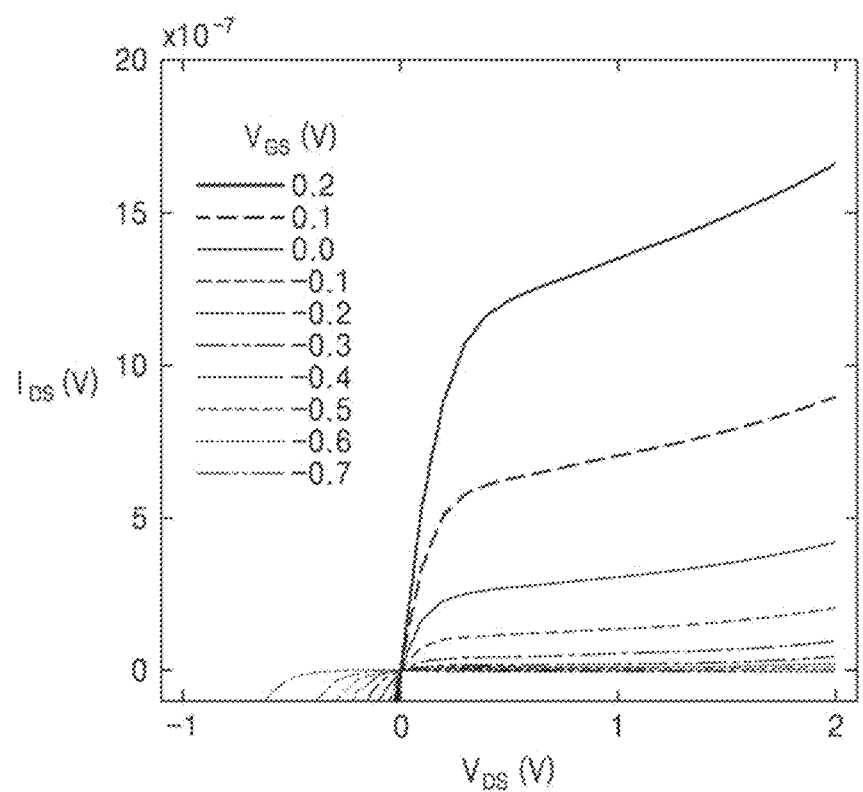
FIGS. 21A and 21B show I-V characteristics of an opto-electronic device sample according to an example embodiment in a dark state, which includes a channel region having a size of about 2×2 μm and has a JFET structure.
Figure 21B:
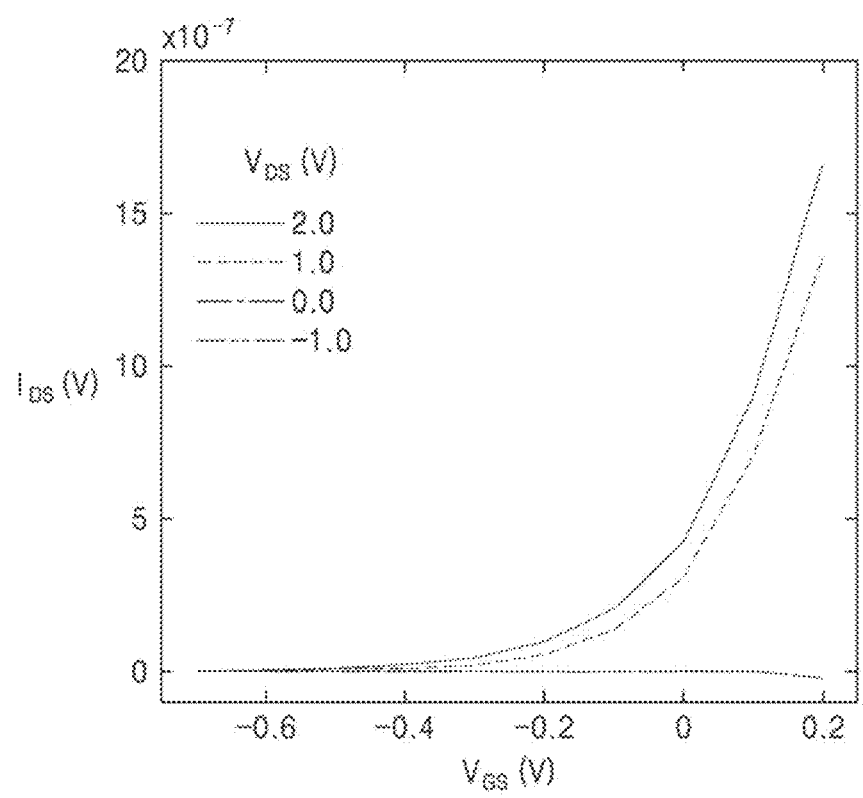

FIGS. 20A and 20B show I-V characteristics of an opto-electronic device sample according to an example embodiment in a dark state, which includes a channel region having a size of about 50×50 µm and has a JFET (junction field-effect transistor) structure. 21A and 21B show I-V characteristics of an opto-electronic device sample according to an example embodiment in a dark state, which includes a channel region having a size of about 2×2 µm and has a JFET structure. FIGS. 20A and 21A show I-V characteristics of an opto-electronic device according to a gate voltage which is applied thereto, and FIGS. 20B and 21B show changes in source/drain current of the opto-electronic device for the gate voltage.

As can be seen from FIGS. 20A and 20B, and FIGS. 21A and 21B, when a reverse bias voltage less than or equal to a certain value is applied as the gate voltage, the source/drain current converges to zero, and thus, dark noise is almost zero.

Figure 22:
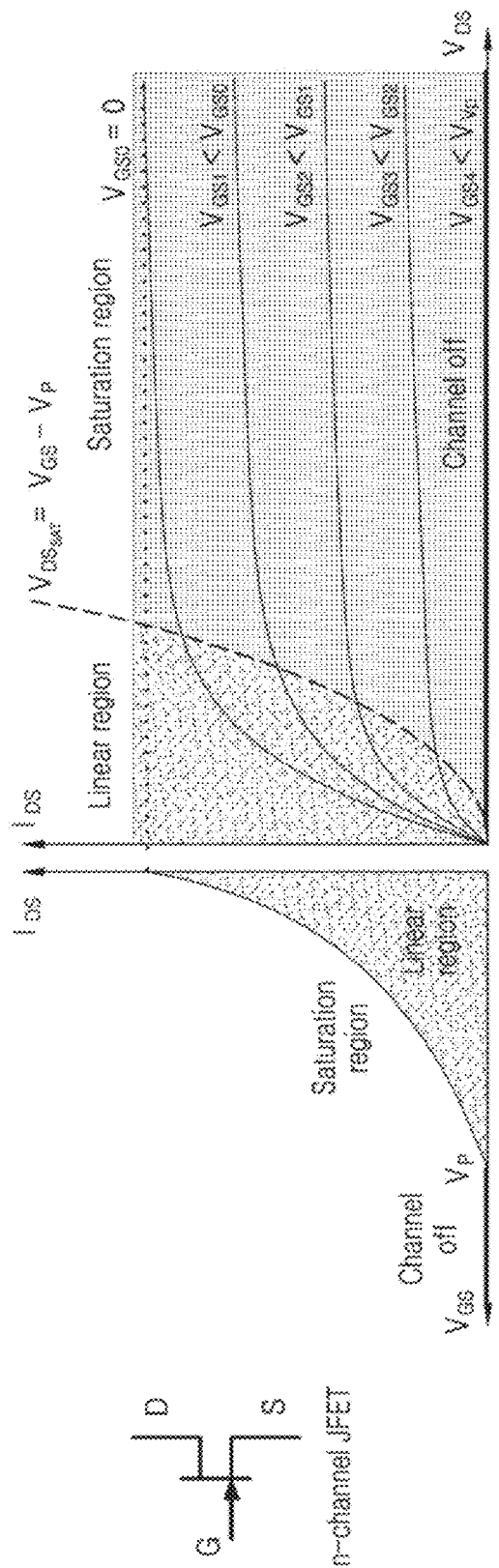
FIG. 22 shows graphs of characteristics of an n-channel JFET.

FIG. 22 shows graphs of characteristics of an n-channel JFET. In FIG. 22, the left graph shows a relationship between a gate voltage VGS and a source/drain current IDS, and the right graph shows I-V characteristics according to the applied gate voltage.

Figure 23:
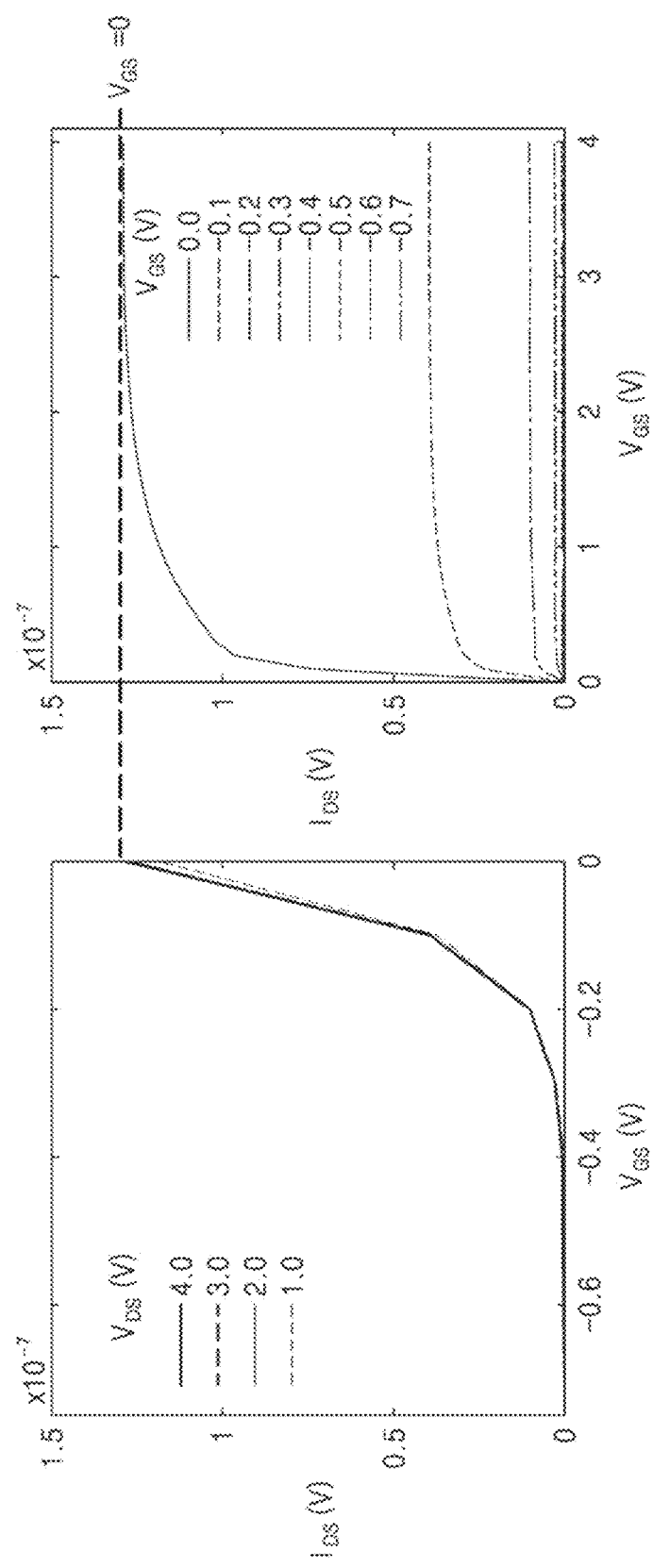
FIG. 23 shows I-V characteristics of an opto-electronic device sample according to an example embodiment in a dark state, which includes a channel region having a size of about 50×50 μm and has a JFET structure.

FIG. 23 show I-V characteristics of an opto-electronic device sample according to an example embodiment in a dark state, which includes a channel region having a size of about 50×50 µm and has a JFET structure. In FIG. 23, the left graph shows a relationship between the gate voltage VGS and the source/drain current IDS, and the right graph shows I-V characteristics according to the applied gate voltage.

As can be seen from a comparison between FIG. 22 and FIG. 23, when the opto-electronic device according to the example embodiment is formed to have a JFET structure, characteristics of the JFET are exhibited.

In the opto-electronic devices 100, 200, 300, 400, 500, and 600 according to the example embodiments described above, dark noise may be reduced by including the quantum dot layer 50 limited by the bank structure 40, and by using a plurality of quantum dots 51, more photocarriers than photons incident on the opto-electronic device per unit time may be generated, and thus, a gain greater than 1 may be obtained and light-receiving efficiency may be increased.

The opto-electronic devices 100, 200, 300, 400, 500, and 600 described above may be used alone as a light-receiving element or may be arranged in a two-dimensional array to constitute an image sensor.

Figure 24:
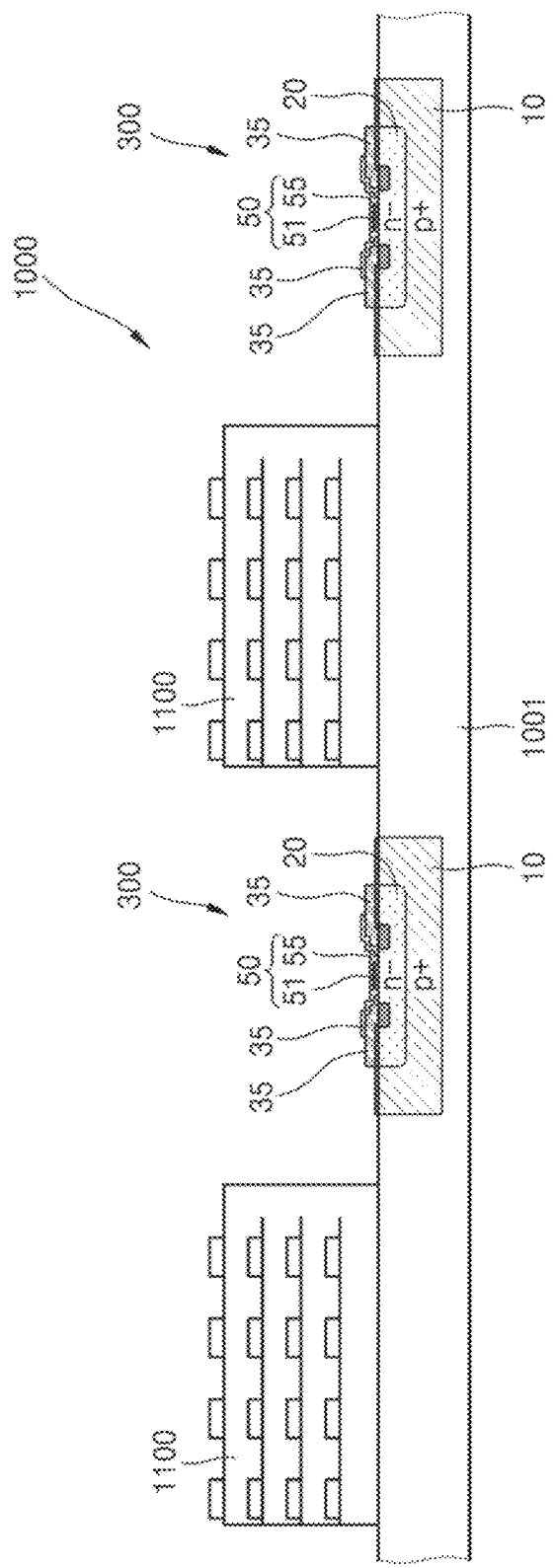
FIG. 24 is a cross-sectional view schematically showing a structure of an image sensor to which a plurality of opto-electronic devices according to an example embodiment are applied.

FIG. 24 is a cross-sectional view schematically showing a structure of an image sensor 1000 to which a plurality of opto-electronic devices 100, 200, 300, 400, 500, or 600 according to an example embodiment are applied. FIG. 24 shows an example of a case in which the opto-electronic device 300 described with reference to FIG. 5 is applied to the image sensor 1000. The opto-electronic devices 100, 200, 300, 400, 500, and 600 according to various example embodiments described above may be applied to the image sensor 1000.

Referring to FIG. 24, the image sensor 1000 includes an array of a plurality of opto-electronic devices 100, 200, 300, 400, 500, or 600 formed on a substrate 1001 and a plurality of drive circuits 1100 for outputting signals from each of the plurality of the opto-electronic devices 100, 200, 300, 400, 500, or 600. FIG. 24 shows only two opto-electronic devices 300 and two drive circuits 1100 for convenience, but in practice, many opto-electronic devices and drive circuits may be arranged in the form of a two-dimensional array.

The above-described opto-electronic devices 100, 200, 300, 400, 500, and 600 have low dark noise and high sensitivity, and thus, the image sensor 1000 may obtain a clear image even with weak incident light. In addition, sizes of pixels included in the image sensor 1000 may be further reduced, and thus, a resolution of the image sensor may be further increased. The image sensor 1000 may be implemented, for example, as a CMOS image sensor.

In addition, by changing sizes of the plurality of quantum dots in the above-described opto-electronic devices 100, 200, 300, 400, 500, and 600 to correspond to a wavelength range to be detected, an image sensor or a quantum dot image sensor may be implemented, or various optical sensors such as an optical device, an infrared sensor, and an infrared image sensor, which detect light in a desired wavelength range, may be implemented.

The opto-electronic devices 100, 200, 300, 400, 500, and 600, including the quantum dot layers 50 limited by the above-described bank structures 40 and 540, and the image sensor 1000 including the opto-electronic device are described with reference to the embodiments shown in the drawings, but the embodiments are only examples, and those skilled in the art will understand that various modifications and equivalent other embodiments may be made therefrom. Therefore, the disclosed embodiments should be considered from an illustrative point of view rather than a limiting point of view. The scope of rights is represented in the claims rather than the above description, and all differences within the same scope should be construed as being included in the scope of rights.

According to an opto-electronic device and an image sensor including the same of the example embodiments, a plurality of quantum dots are used as a light-absorbing material, and thus, low dark noise and a high signal-to-noise ratio may be achieved.

In addition, a quantum dot layer is formed by using a bank structure in which an uppermost surface is higher than an upper surface of a light-receiving region including the quantum dot layer, and thus, a layer in which a plurality of quantum dots are evenly arranged may be obtained and a more uniform quantum dot layer may be formed.

It should be understood that example embodiments described herein should be considered in a descriptive sense only and not for purposes of limitation. Descriptions of features or aspects within each embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. An opto-electronic device comprising:
   a base portion;
   a first electrode provided on an upper surface of the base portion;
   a second electrode provided on the upper surface of the base portion and spaced apart from the first electrode;
   a quantum dot layer provided between the first electrode and the second electrode on the base portion, the quantum dot layer comprising a plurality of quantum dots; and
   a bank structure covering at least a first partial region of the first electrode and at least a second partial region of the second electrode, the bank structure defining a region where the quantum dot layer is formed and comprising an inorganic material,
   wherein the first electrode and the second electrode each have a step structure such that a first upper surface thereof is higher than a second upper surface thereof, and
   wherein a lateral distance from the first upper surface to the quantum dot layer is greater than a lateral distance from the second upper surface to the quantum dot layer.

2. The opto-electronic device of claim 1, wherein a light-receiving region of the opto-electronic device comprises the quantum dot layer, and
   wherein an uppermost surface of the bank structure is higher than an upper surface of the light-receiving region.

3. The opto-electronic device of claim 1, wherein a first stripe of the bank structure is provided on a first side of the quantum dot layer and a second stripe of the bank structure is provided on a second side of the quantum dot layer opposite to the first side, or
   wherein the bank structure surrounds the quantum dot layer.

4. The opto-electronic device of claim 3, wherein the bank structure has a rectangular ring structure.

5. The opto-electronic device of claim 1, wherein the bank structure comprises an inorganic oxide.

6. The opto-electronic device of claim 1, wherein the bank structure comprises any one of $SiO_2$, $Si_3N_4$, $Al_2O_3$, and $HfO_2$.

7. The opto-electronic device of claim 1, further comprising an oxide layer formed on at least one side of the quantum dot layer, wherein the plurality of quantum dots are in contact with the upper surface of the base portion and the oxide layer covers the plurality of quantum dots, or wherein the plurality of quantum dots are in contact with an upper surface of the oxide layer, or wherein the plurality of quantum dots are surrounded by the oxide layer.

8. The opto-electronic device according to claim 7, wherein the oxide layer comprises a transparent oxide semiconductor material.

9. The opto-electronic device of claim 8, wherein the transparent oxide semiconductor material comprises at least one selected from among silicon indium zinc oxide (SIZO), silicon zinc tin oxide (SZTO), indium gallium zinc oxide (IGZO), indium zinc oxide (IZO), zinc tin oxide (ZTO), and indium tin oxide (ITO).

10. The opto-electronic device of claim 1, wherein the base portion comprises:
a first semiconductor layer doped with a first conductivity type; and
a second semiconductor layer provided on an upper surface of the first semiconductor layer, the second semiconductor layer being doped with a second conductivity type different from the first conductivity type,
wherein the upper surface of the base portion comprises an upper surface of the second semiconductor layer,
wherein the first electrode and the second electrode are electrically connected to the second semiconductor layer, and
wherein the quantum dot layer is formed between the first electrode and the second electrode on the second semiconductor layer.

11. The opto-electronic device of claim 10, wherein the base portion further comprises a first doped region and a second doped region spaced apart from the first doped region,
wherein the first doped region and the second doped region are doped with different concentrations from a concentration of the second semiconductor layer,
wherein the first electrode and the second electrode are electrically connected respectively to the first doped region and the second doped region, and
wherein the bank structure is in contact with the upper surface of the second semiconductor layer in a region of the second semiconductor layer between the first doped region and the second doped region to block electrical connection between the quantum dot layer and the first and second doped regions.

12. The opto-electronic device of claim 11, wherein the second semiconductor layer is formed by doping a partial region of the base portion with the second conductivity type, or
wherein the second semiconductor layer is formed on the first semiconductor layer to have a step difference from the first semiconductor layer.

13. The opto-electronic device of claim 1, wherein the base portion comprises:
a substrate;
a gate provided on the substrate; and
an insulating layer provided on the substrate,
wherein the first electrode and the second electrode are spaced apart from each other on the insulating layer,
wherein the first electrode extends on a first side of the gate and the second electrode extends on a second side of the gate opposite to the first side,
wherein the gate is positioned below and between the first electrode and the second electrode, and wherein the bank structure is formed to define the region of the quantum dot layer on the first electrode and the second electrode.

14. The opto-electronic device of claim 13, wherein the substrate comprises a glass substrate or a semiconductor substrate.

15. An image sensor comprising:
an array of a plurality of opto-electronic devices; and
a drive circuit configured to output signals respectively received from the plurality of opto-electronic devices,
wherein each of the plurality of opto-electronic devices comprises the opto-electronic device according to claim 1.

16. The image sensor of claim 15, wherein the base portion comprises:
a substrate;
a gate formed on the substrate; and
an insulating layer formed on the substrate,
wherein the first electrode and the second electrode are formed apart from each other on the insulating layer,
wherein the first electrode extends on a first side of the gate and the second electrode extends on a second side of the gate opposite to the first side,
wherein the gate is positioned below and between the first electrode and the second electrode, and
wherein the bank structure is formed to define the region of the quantum dot layer on the first electrode and the second electrode.

17. The image sensor of claim 16, wherein the substrate comprises a glass substrate or a semiconductor substrate.

18. The image sensor of claim 15, wherein the base portion of each of the plurality of opto-electronic devices comprises:
a first semiconductor layer doped with a first conductivity type; and
a second semiconductor layer provided on an upper surface of the first semiconductor layer, the second semiconductor layer being doped with a second conductivity type different from the first conductivity type,
wherein the upper surface of the base portion comprises an upper surface of the second semiconductor layer,
wherein the first electrode and the second electrode are electrically connected to the second semiconductor layer, and
wherein the quantum dot layer is formed between the first electrode and the second electrode on the second semiconductor layer.

19. The image sensor of claim 18, wherein the base portion further comprises a first doped region and a second doped region spaced apart from the first doped region,
wherein the first doped region and the second doped region are doped with different concentrations from a concentration of the second semiconductor layer,
wherein the first electrode and the second electrode are electrically connected respectively to the first doped region and the second doped region, and
wherein the bank structure is in contact with the upper surface of the second semiconductor layer in a region of the second semiconductor layer between the first doped region and the second doped region to block electrical connection between the quantum dot layer and the first and second doped regions.

20. The image sensor of claim 19, wherein the second semiconductor layer is formed by doping a partial region of the base portion with the second conductivity type, or wherein the second semiconductor layer is formed on the first semiconductor layer to have a step difference from the first semiconductor layer.

\* \* \* \* \*